(12) United States Patent
Tsujiuchi et al.

(10) Patent No.: US 9,583,604 B2
(45) Date of Patent: Feb. 28, 2017

(54) SEMICONDUCTOR DEVICE WITH IMPROVED SHORT CIRCUIT CAPABILITY

(71) Applicant: Renesas Electronics Corporation, Kawasaki-shi, Kanagawa (JP)

(72) Inventors: Mikio Tsujiuchi, Kawasaki (JP); Tetsuya Nitta, Kawasaki (JP)

(73) Assignee: Renesas Electronics Corporation, Kanagawa (JP)

( * ) Notice: Subject to any disclaimer, the term of this patent is extended or adjusted under 35 U.S.C. 154(b) by 0 days.

(21) Appl. No.: 14/500,324

(22) Filed: Sep. 29, 2014

(65) Prior Publication Data

US 2015/0108541 A1    Apr. 23, 2015

(30) Foreign Application Priority Data

Oct. 17, 2013  (JP) .................................. 2013-216464

(51) Int. Cl.

| H01L 29/66 | (2006.01) |
|---|---|
| H01L 29/739 | (2006.01) |
| H01L 29/06 | (2006.01) |
| H01L 29/10 | (2006.01) |

(52) U.S. Cl.
CPC ...... *H01L 29/7395* (2013.01); *H01L 29/0696* (2013.01); *H01L 29/1033* (2013.01); *H01L 29/1095* (2013.01); *H01L 29/7393* (2013.01)

(58) Field of Classification Search
CPC ............. H01L 2924/00; H01L 29/0696; H01L 27/1203; H01L 21/84; H01L 29/1095; H01L 29/7397; H01L 29/0847; H01L 29/1083; H01L 29/7816; H01L 29/7835; H01L 29/7395; H01L 29/66333; H01L 29/397

USPC .......... 257/E27.112, E21.703, E29.201, 139, 257/247, 517; 438/149, 270, 289, 309, 438/421

See application file for complete search history.

(56) References Cited

U.S. PATENT DOCUMENTS

| 5,343,052 | A | | 8/1994 | Oohata et al. |
|---|---|---|---|---|
| 6,002,153 | A | * | 12/1999 | Tsunoda ............... H01L 29/7395 257/139 |
| 6,392,859 | B1 | * | 5/2002 | Ohshima ............. H01L 27/0248 257/E27.112 |

(Continued)

FOREIGN PATENT DOCUMENTS

| EP | 2124257 A1 | 11/2009 |
|---|---|---|
| JP | 5-29614 A | 2/1993 |
| WO | 2013121548 A1 | 8/2013 |

OTHER PUBLICATIONS

Communication dated Feb. 20, 2015, issued by the European Patent Office in corresponding European Application No. 14187904.9.

*Primary Examiner* — Lex Malsawma
*Assistant Examiner* — Nduka Ojeh
(74) *Attorney, Agent, or Firm* — Sughrue Mion, PLLC

(57) ABSTRACT

A semiconductor device in which short circuit capability can be improved while decline in overall current capability is suppressed. In the semiconductor device, a plurality of IGBTs (insulated gate bipolar transistors) arranged in a row in one direction over the main surface of a semiconductor substrate include an IGBT located at an extreme end in the one direction and an IGBT located more centrally than the IGBT located at the extreme end. The current capability of the IGBT located at the extreme end is higher than the current capability of the IGBT located centrally.

7 Claims, 25 Drawing Sheets

(56) References Cited

U.S. PATENT DOCUMENTS

| | | | |
|---|---|---|---|
| 7,279,768 B2* | 10/2007 | Kanda | H01L 29/1083 |
| | | | 257/487 |
| 8,063,412 B2* | 11/2011 | Tsuno | H01L 27/0207 |
| | | | 257/173 |
| 2007/0205442 A1* | 9/2007 | Torii | 257/288 |
| 2009/0289277 A1* | 11/2009 | Yamaguchi | H01L 24/49 |
| | | | 257/139 |
| 2009/0321852 A1 | 12/2009 | Yoneda et al. | |
| 2013/0062662 A1 | 3/2013 | Tsujiuchi et al. | |
| 2015/0014744 A1 | 1/2015 | Tsujiuchi et al. | |

* cited by examiner

SEMICONDUCTOR DEVICE WITH IMPROVED SHORT CIRCUIT CAPABILITY

CROSS-REFERENCE TO RELATED APPLICATIONS

The disclosure of Japanese Patent Application No. 2013-216464 filed on Oct. 17, 2013 including the specification, drawings and abstract is incorporated herein by reference in its entirety.

BACKGROUND

The present invention relates to semiconductor devices.

Lateral IGBTs (Insulated Gate Bipolar Transistors) have been known and one example of lateral IGBT is disclosed in Japanese Unexamined Patent Application Publication No. Hei5(1993)-29614.

SUMMARY

In high-breakdown voltage elements such as lateral IGBTs, the stability of element characteristics is ensured by arranging elements at regular intervals in a loopback manner symmetrically to prevent concentration of current attributable to uneven operation. In this type of high-breakdown voltage element, in order to improve the short circuit capability of the element, it is necessary to lower the overall current capability of the element. In other words, improvement in short circuit capability is incompatible with improvement in current capability.

The above and further objects and novel features of the invention will more fully appear from the following detailed description in this specification and the accompanying drawings.

According to one aspect of the present invention, there is provided a semiconductor device which includes elements having a plurality of insulated gate transistor parts arranged in a row in one direction over the main surface of a semiconductor substrate, in which the elements include an element located at an extreme end in one direction and an element located more centrally than the element located at the extreme end. The current capability of the element located at the extreme end is higher than the current capability of the element located centrally.

In the semiconductor device according to the above aspect of the present invention, the current capability of the element located at the extreme end is higher than the current capability of the element located centrally, so short circuit capability is improved while decline in overall current capability is suppressed.

DETAILED DESCRIPTION

Next, the preferred embodiments of the present invention will be described referring to the accompanying drawings.

First Embodiment

First, the structure of the semiconductor device according to a first embodiment will be described.

Figure 1:
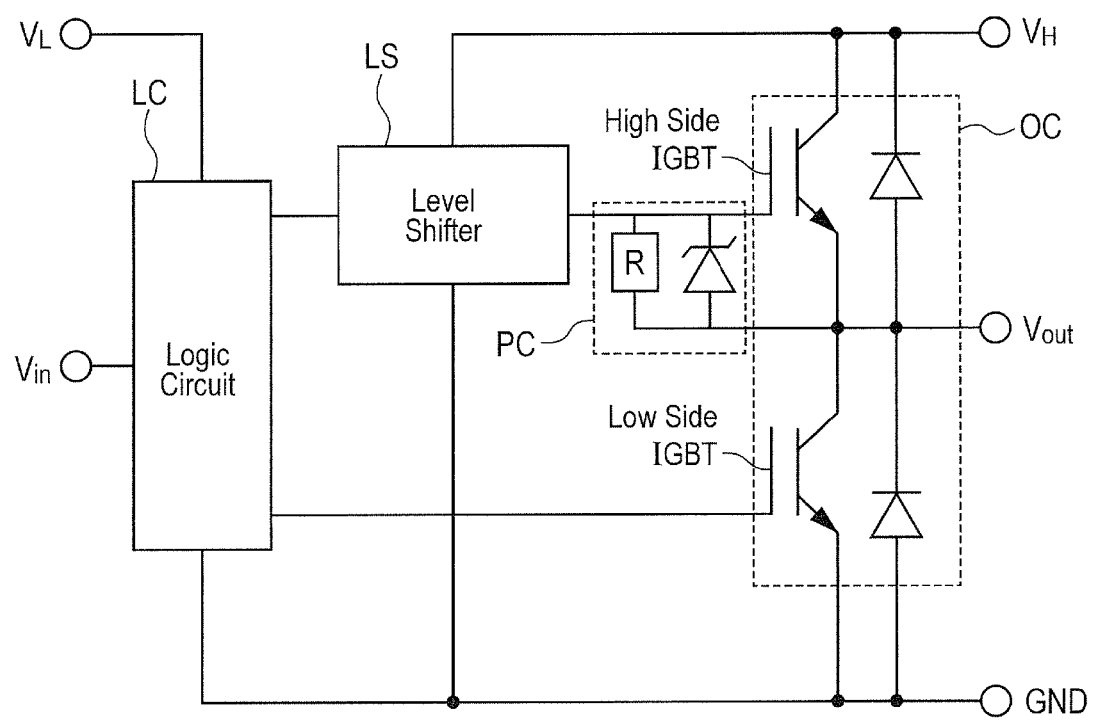
FIG. 1 is a circuit diagram showing a semiconductor device according to a first embodiment of the present invention which is applied to a PDP (Plasma Display Panel) scan driver.

Referring to FIG. 1, a PDP scan driver circuit includes an output circuit OC, a level shifter LS, a logic circuit LC, and a protection circuit PC. The output circuit OC includes a totem pole circuit which uses two (low-side ad high-side) IGBTs as main switch elements. The totem pole circuit is coupled between a terminal supplied with first drive voltage ($V_H$) and a terminal supplied with second drive voltage (GND) and designed to supply direct current output $V_{out}$ from an output terminal to a load. In each of the low-side and high-side IGBTs, a diode is reversely coupled between an emitter and a collector.

The logic circuit LC is coupled to the gate electrode of the low-side IGBT of the output circuit OC. Also, the logic circuit LC is coupled to the gate electrode of the high-side IGBT through the level shifter LS and the protection circuit PC.

Figures 2A, 2B:
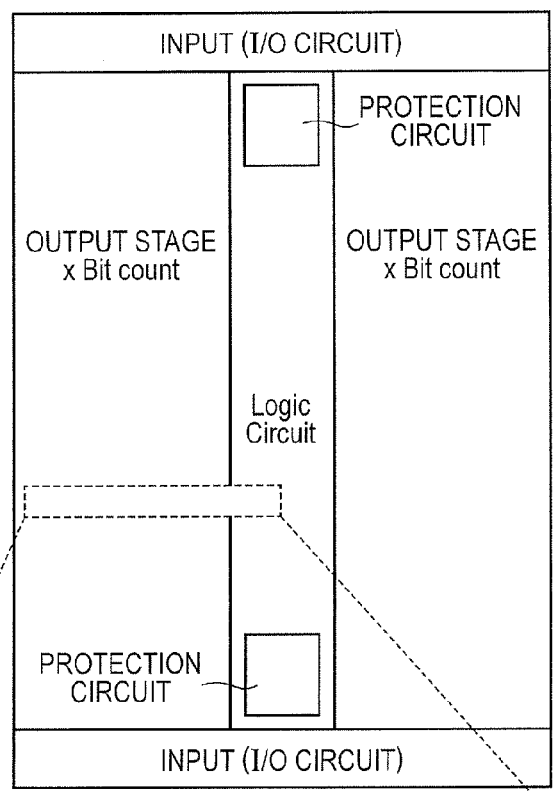
FIG. 2A is a schematic diagram of the planar layout of the whole chip of the PDP scan driver to which the semiconductor device according to the first embodiment is applied and FIG. 2B is a schematic diagram of the planar layout of each bit of the chip shown in FIG. 2A.

Referring to FIG. 2A, in the semiconductor chip of the above PDP scan driver, the same number of output stages as the number of bits (bit count) are disposed on the right and left sides as seen in the figure in a way to sandwich the protection circuit PC and the logic circuit LC. In addition, I/O (Input/Output) circuits are disposed at the top and bottom sides as seen in the figure in a way to sandwich the output stages and the logic circuit LC.

Referring to FIG. 2B, each output stage includes a level shifter, a high-side IGBT, a low-side IGBT, diodes and an output pad for each bit.

Figure 3:
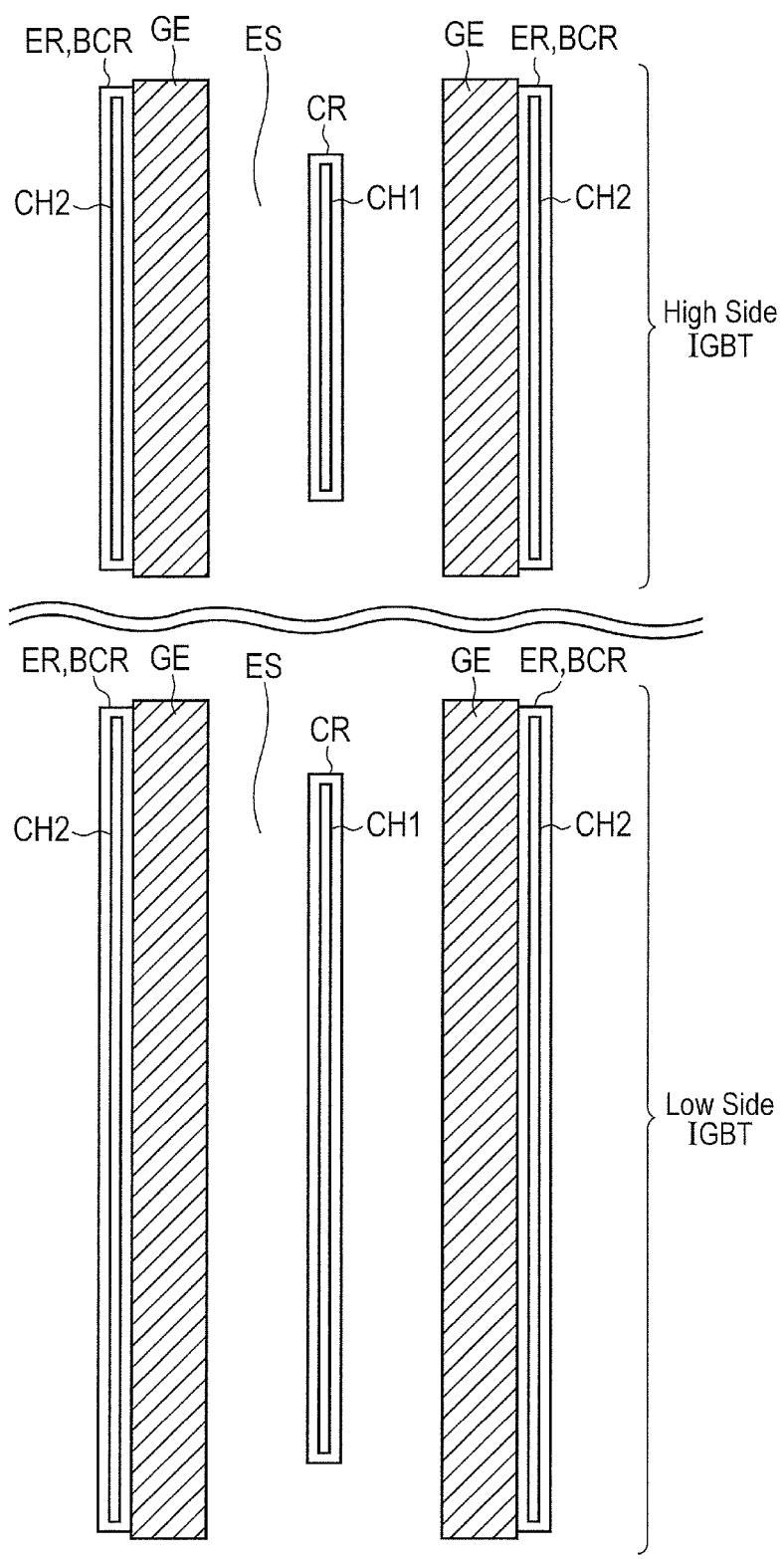
FIG. 3 is a plan view showing the high-side IGBT and low-side IGBT shown in FIGS. 1, 2A, and 2B.

Referring to FIG. 3, the high-side IGBT is, for example, a breakdown voltage-oriented element and the low-side IGBT is a current-oriented element. The high-side IGBT is designed to have a lower doping concentration in the drift region or a longer collector-emitter distance than the low-side IGBT to provide high breakdown voltage. The low-side IGBT is designed to have a larger channel width or a lower channel resistance than the high-side IGBT to provide high current drive capability.

Figure 4:
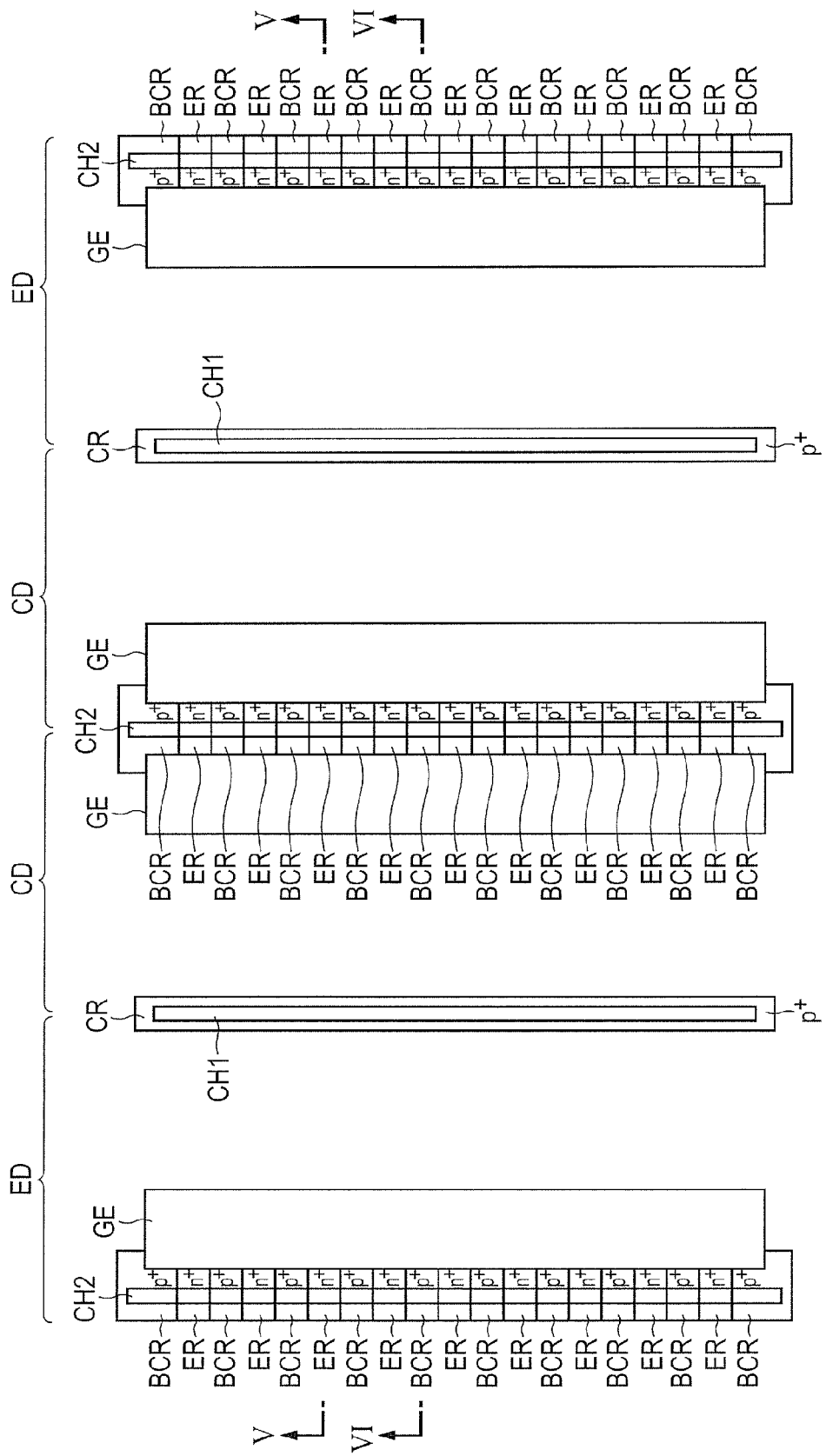
FIG. 4 is a plan view showing elements located centrally and elements located at extreme ends as IGBTs shown in FIGS. 1, 2A, and 2B.
Figure 5:
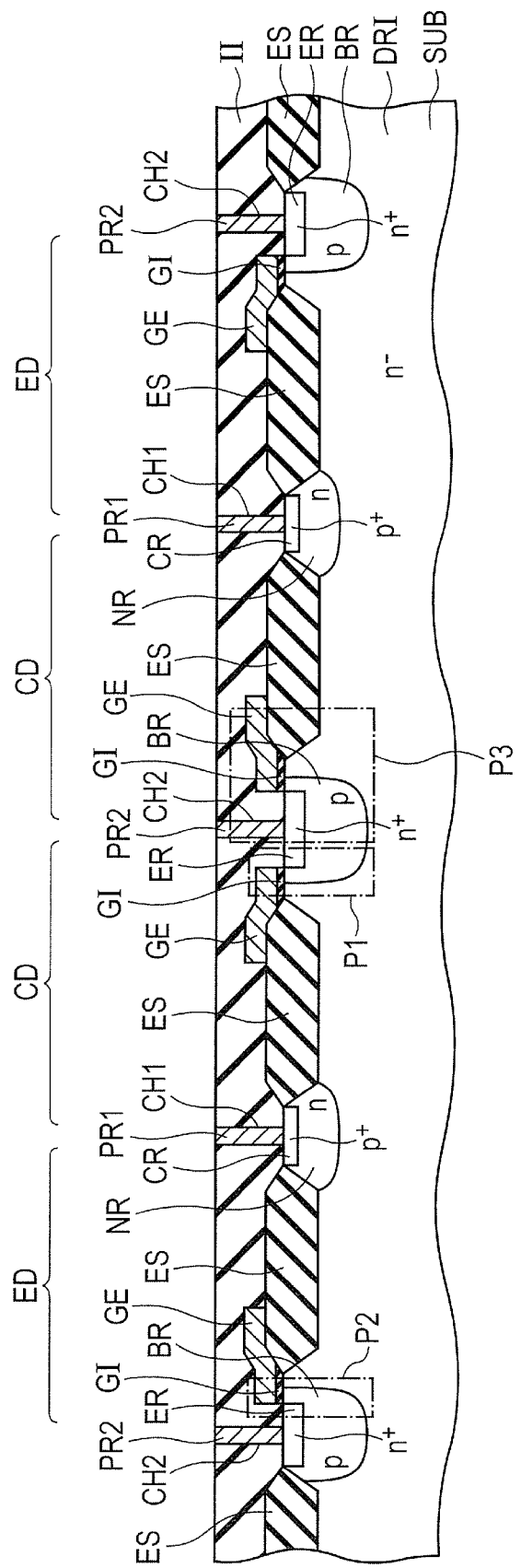
FIG. 5 is a schematic sectional view taken along the line V-V in FIG. 4.
Figure 6:
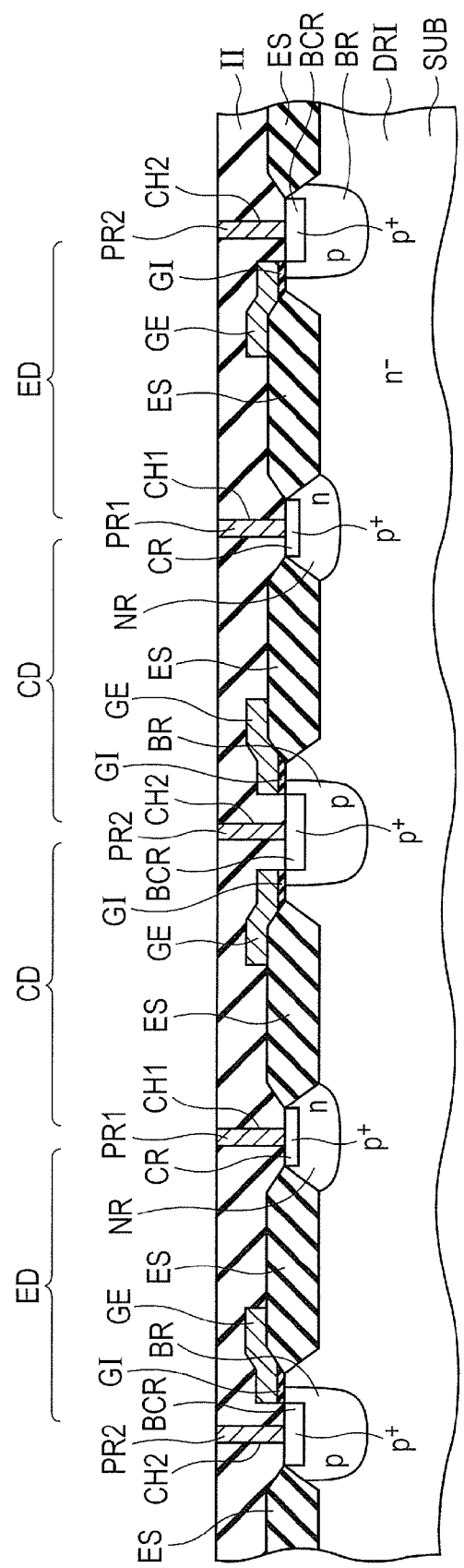
FIG. 6 is a schematic sectional view taken along the line VI-VI in FIG. 4.

Referring to FIGS. 4 to 6, the semiconductor device includes IGBTs having a plurality of insulated gate transistor parts which are arranged in a row in one direction over the main surface of a semiconductor substrate SUB. Two IGBTs (ED, ED) are located at the extreme ends in the one direction. Two IGBTs (IGBTCD) are located more centrally or nearer to the center than these IGBTs at the extreme ends (IGBTED). The IGBTs located at the extreme ends (IGBTED) and the IGBTs located centrally (IGBTCD) are linearly symmetrical with respect to neighboring virtual centerlines of the two IGBTs located centrally (IGBTCD).

The current capability of the IGBTED at the extreme ends is larger than the current capability of the IGBTCD located centrally.

Each IGBT mainly includes an $n^-$ drift region DRI, n-type region NR, $p^+$ collector region (first conductivity type collector region) CR, p-type base region (first conductivity type base region) BR, BCR, $n^+$ emitter region (first conductivity type source region) ER, gate insulating film GI, and gate electrode GE.

The $n^-$ drift region DRI is formed in the semiconductor substrate SUB. The n-type region NR is formed inside the semiconductor substrate SUB in contact with the $n^-$ drift region DRI. The $p^+$ collector region CR is formed in the main surface of the semiconductor substrate SUB in the semiconductor substrate SUB so as to make a PN junction with the n-type region NR.

The p-type base region BR, BCR is formed in the main surface of the semiconductor substrate SUB in the semiconductor substrate SUB separately from the $p^+$ collector region CR so as to make a PN junction with the $n^-$ drift region DRI. The p-type base region BR, BCR includes a p-type region BR to make a PN junction with the $n^-$ drift region DRI and a $p^+$ base contact region BCR located in the main surface of the semiconductor substrate SUB. The $p^+$ base contact region BCR has a higher p-type doping concentration than the p-type region BR. The $n^+$ emitter region ER is formed in the main surface of the semiconductor substrate SUB inside the p-type base region BR, BCR so as to make a PN junction with the p-type base region BR, BCR.

An element separation structure ES is formed between the $p^+$ collector region CR and the p-type base regions BR, BCR in the main surface of the semiconductor substrate SUB. This element separation structure ES may be a silicon oxide film made by LOCOS (Local Oxidation of Silicon) or STI (Shallow Trench Isolation).

The gate electrode GE is formed at least over the p-type region BR between the $n^+$ emitter region ER and the $n^-$ drift region DRI through the gate insulating film GI. An end portion of the gate electrode GE lies over the element isolation structure ES so as to be opposite to the $n^-$ drift region DRI with the element separation structure ES between them.

An interlayer insulating film II is formed over the main surface of the semiconductor substrate SUB in which IGBTs lie, in a way to cover the IGBTs. Contact holes CH1 and CH2 are made in the interlayer insulating film II. The contact hole CH1 extends down from the top surface of the interlayer insulating film II, reaching the $p^+$ collector region CR. The contact hole CH2 extends down from the top surface of the interlayer insulating film II, reaching both the $n^+$ emitter region ER and $p^+$ base contact region BCR.

A plug layer (collector conductive layer) PR1 of conductive material is formed in a way to fill the inside of the contact hole CH1. Also, a plug layer (emitter conductive layer) PR2 of conductive material is formed in a way to fill the inside of the contact hole CH2. Metal wiring (not shown) is formed over the interlayer insulating film II in contact with the plug layers PR1 and PR2.

As shown in FIG. 4, both the contact holes CH1 and CH2 have aline contact (slit contact) structure. The line contact structure refers to a structure which has roughly the shape of a rectangle (including a rectangle with somewhat round corners) in a plan view, in which the length of one side of the roughly rectangular contact hole is not less than twice the length of the other side.

Since the contact hole CH1 reaches the p+ collector region CR, the plug layer PR1 buried in the contact hole CH1 is coupled to the p+ collector region CR.

In each IGBT, n+ emitter regions ER and p+ base contact regions BCR are alternately arranged along the gate width direction (top-bottom direction in FIG. 4). The emitter side contact hole CH2 is formed so as to reach the n+ emitter regions ER and p+ base contact regions BCR. Therefore, the plug layer PR2 buried in the contact hole CH2 is coupled to the n+ emitter regions ER and p+ base contact regions BCR.

The two IGBTs located centrally (IGBTCD) share an plug layer PR2. Also, the two IGBTs located centrally (IGBTCD) share n+ emitter regions ER as shown in FIG. 5 and p+ base contact regions BCR as shown in FIG. 6. Each of the two IGBTs (IGBTED), located more outward than the two IGBTs (IGBTCD), shares a p+ collector region CR and a plug layer PR2 with the IGBTCD adjacent to it.

Figure 7A:
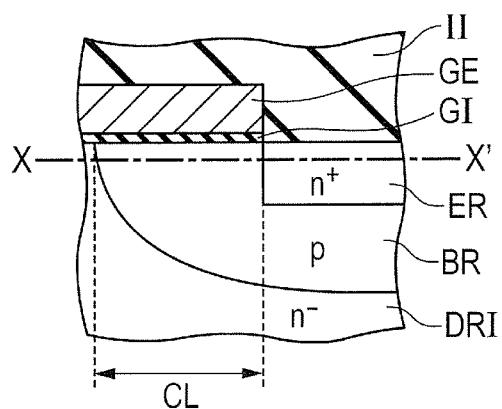
FIG. 7A is an enlarged view of part P1 in FIG. 5
Figure 7B:
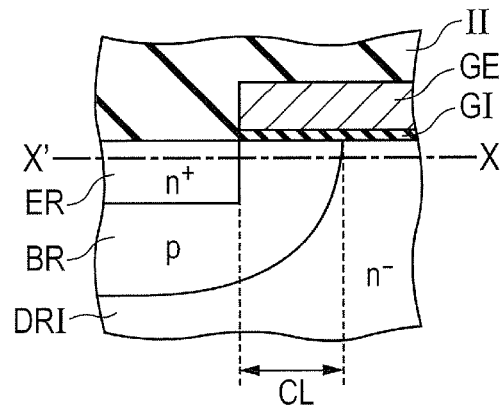
FIG. 7B is an enlarged view of part P2 in FIG. 5.

Referring to FIGS. 7A and 7B, channel length CL of the IGBT CD located centrally as shown in FIG. 7A is longer than channel length CL of the IGBTED at the extreme end as shown in FIG. 7B.

Figure 8:
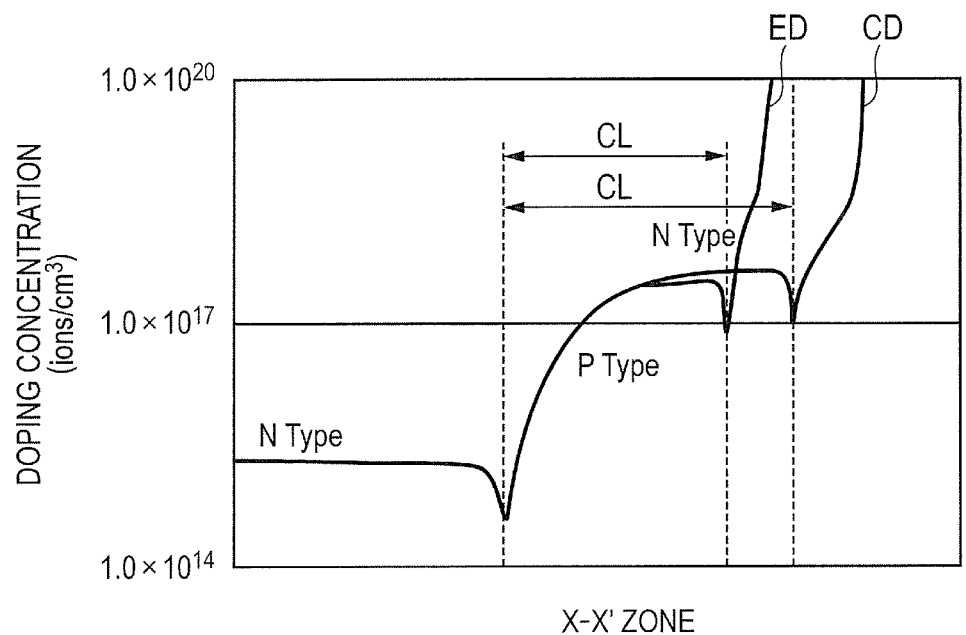
FIG. 8 is a graph showing the doping profile along the line X-X' in FIGS. 7A and 7B.

Referring to FIGS. 7A, 7B and 8, the channel length CL of each of the IGBTCD (located centrally) and the IGBTED (located at the extreme end) is the length of the p-type base region BR below the gate electrode GE in the above one direction. The doping profile in the X-X' zone shown in FIG. 8 represents change in doping concentration in the area from the n− drift region DRI through the p-type base region BR to the n+ emitter region ER. The channel length CL of each of the IGBTCD (located centrally) and the IGBTED (located at the extreme end) corresponds to the range of high p-type doping concentrations as shown in FIG. 8. The graph shows that the range of high p-type doping concentrations of the IGBTCD (located centrally) is longer than the range of high p-type doping concentrations of the IGBTED (located at the extreme end).

Next, the relation between short circuit capability and current capability which the present inventors have studied will be described. First, the inventors conducted a simulation using a semiconductor device structured as illustrated in FIG. 5. In this simulation, the n+ emitter region ER had a doping concentration on the order of $1 \times 10^{21}$, the p+ collector region CR had a doping concentration on the order of $1 \times 10^{21}$, the p-type region BR had a doping concentration on the order of $1 \times 10^{18}$, the n-type region NR had a doping concentration on the order of $1 \times 10^{15}$, and the n− drift region DRI had a doping concentration on the order of $1 \times 10^{15}$.

Figure 9:
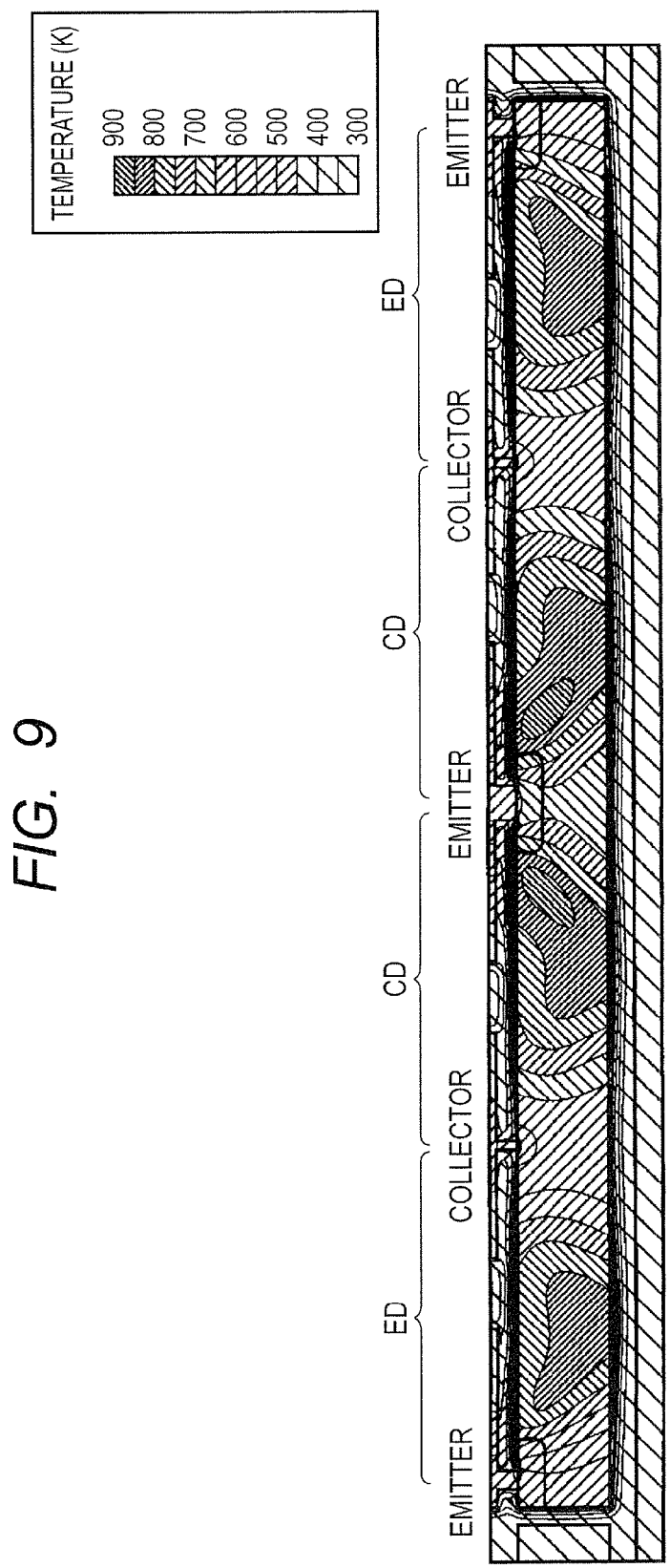
FIG. 9 shows a temperature distribution as the result of simulation using the structure shown in FIG. 5.

Referring to FIG. 9, the temperature of the vicinity of the emitter of the IGBTCD located centrally was high. The temperature of the vicinity of the emitter of the IGBT located centrally (IGBTCD) was higher than the temperature of the vicinity of the emitter of each IGBT located at the extreme end (IGBTED). The reason is that the two IGBTs located centrally (IGBTCD) had each a current path and thus the amount of self-heating of the IGBTs located centrally (IGBTCD) increased.

Figure 10:
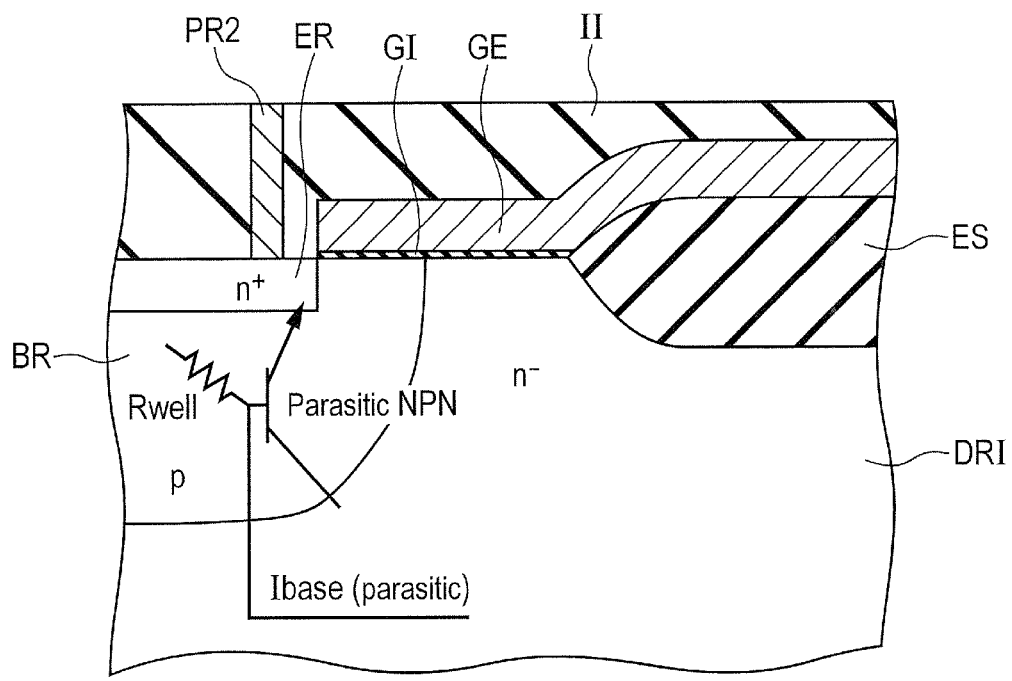
FIG. 10 is an explanatory view illustrating the parasitic bipolar in part P3 in FIG. 5 which is shown in enlarged form.

Referring to FIG. 10, the temperature of the vicinity of the emitter of the IGBTCD (located centrally) is high, so due to its heat, the parasitic NPN (parasitic bipolar), which is formed by the n+ emitter region ER, p-type region BR and n− drift region DRI, turns on.

Figure 11:
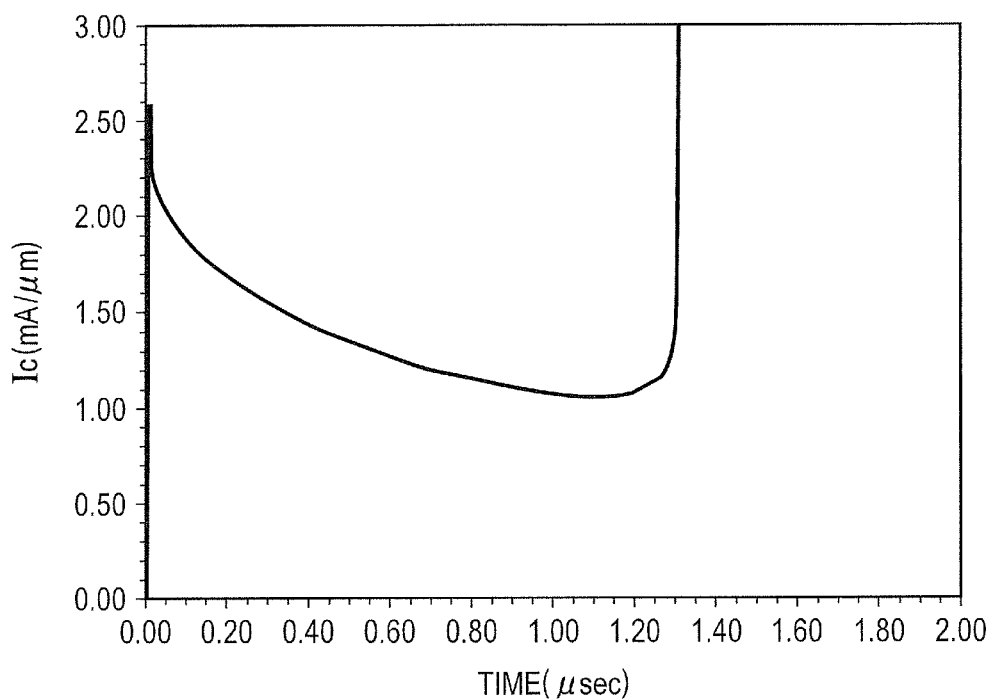
FIG. 11 is a graph of short circuit capability in the vicinity of the emitter of an IGBT located centrally.

Referring to FIG. 11, as the parasitic bipolar turns on, an overcurrent flows. When the overcurrent continues to flow, the temperature rapidly rises, thereby causing the element to break down. Here, the time from when the overcurrent begins flowing until breakdown of the element is defined as short circuit capability. Thus the present inventors have found that the IGBTCD (located centrally) has a dominant influence on short circuit capability.

Figure 12A:
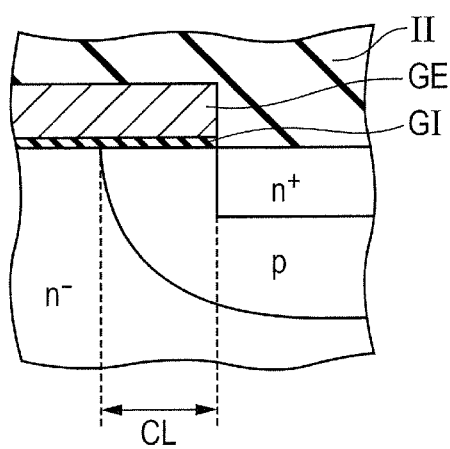
FIG. 12A shows the part of a comparative example corresponding to part P1 in FIG. 5
Figure 12B:
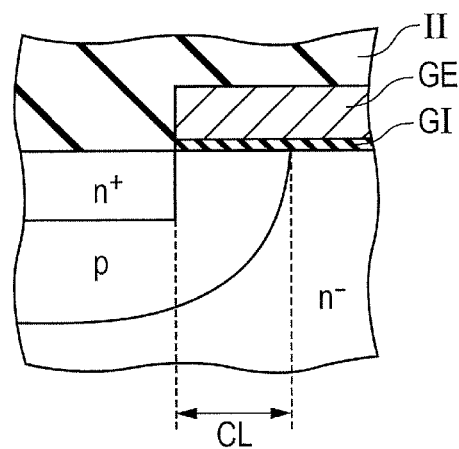
FIG. 12B shows the part of the comparative example corresponding to part P2 in FIG. 5.
Figure 13:
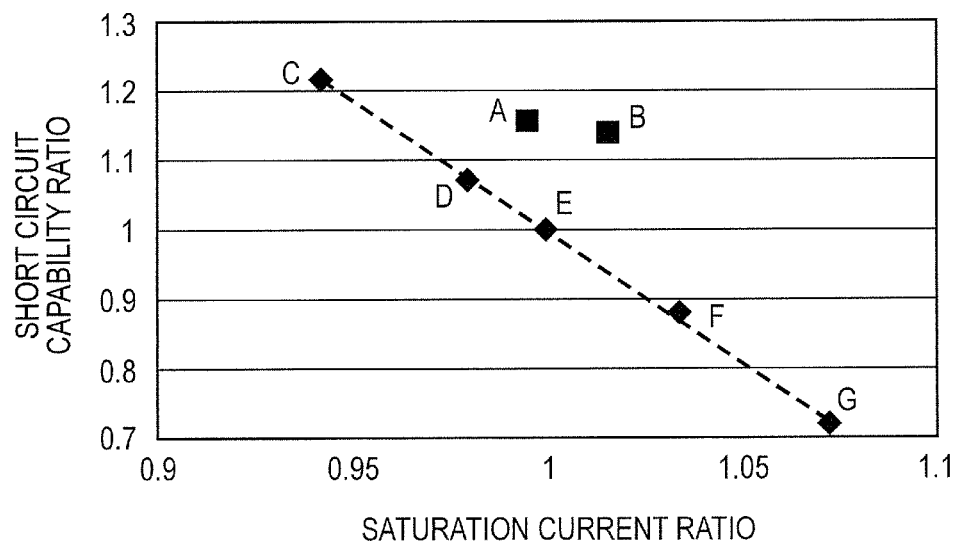
FIG. 13 is a graph showing the relation between short circuit capability ratio and saturation current ratio in embodiments of the present invention and comparative examples.

Next, referring to FIGS. 12A, 12B, and 13, the present inventors compared examples A and B according to this embodiment with comparative examples C to G in terms of short circuit capability and saturation current. The examples A and B have the structure shown in FIGS. 7A and 7B. Specifically, in example A, the channel length of the IGBTCD (located centrally) is 0.2 μm longer and the channel length of the IGBTED (located at the extreme end) is 0.1 μm shorter. In example B, the channel length of the IGBTCD (located centrally) is 0.2 μm longer and the channel length of the IGBTED (located at the extreme end) is 0.2 μm shorter. In comparative examples C to G, the IGBTED (located at the extreme end) and the IGBTCD (located centrally) have the same channel length CL, as shown in FIGS. 12A and 12B.

In the simulation, the inventors measured the short circuit capabilities and saturation currents of the comparative examples and the examples A and B according to this embodiment and investigated the ratios of short circuit capability and saturation current of the examples A and B to those of the comparative examples. In example A, the short circuit capability was approximately 16% higher than in the comparative examples with virtually no decline in saturation current. In example B, the saturation current was approximately 1% higher than in the comparative examples and the short circuit capability was approximately 15% higher. From this simulation result, the present inventors have obtained a finding that when the current capability of the element located at the extreme end is larger than the current capability of the element located centrally, the short circuit capability is improved without a decline in the overall current capability of the element.

Next, the effects of this embodiment will be described.

As mentioned above, in this embodiment, the current capability of the IGBTED (located at the extreme end) is higher than the current capability of the IGBTCD (located centrally). Consequently, self-heating of the IGBTCD (located centrally) is suppressed and thus temperature rise is suppressed. This suppresses overcurrent which may occur when the parasitic bipolar turns on. The suppression of overcurrent prevents the element from breaking down due to a rapid temperature rise. Thus, the short circuit capability can be improved without a decline in the overall current capability of the element.

Furthermore, in this embodiment, the channel length CL of the IGBTCD (located centrally) is longer than the channel length CL of the IGBT located at the extreme end. Therefore, the current of the IGBTCD (located centrally) can be smaller than the current of the IGBTED (located at the extreme end). In other words, the current capability of the IGBT located at the extreme end can be larger than the current capability of the IGBT located centrally.

Second Embodiment

Figure 14:
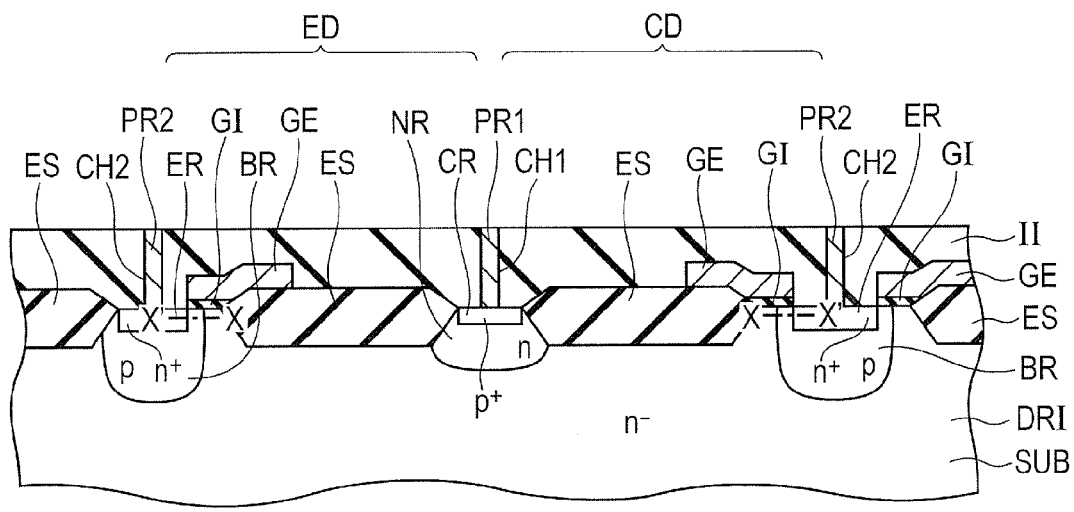
FIG. 14 is a sectional view showing an element located centrally and an element located at an extreme end in a semiconductor device according to a second embodiment of the present invention.
Figure 15:
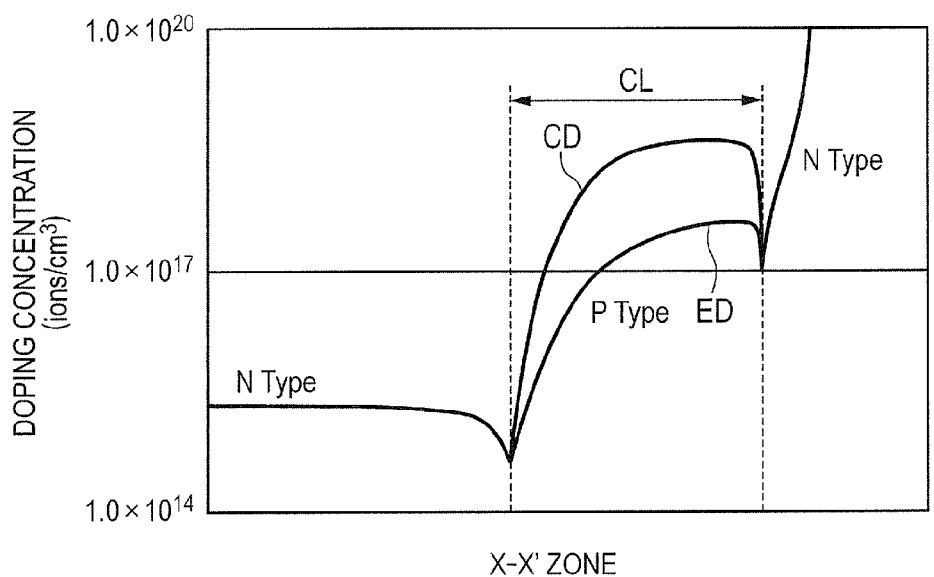
FIG. 15 is a graph showing the doping profile along the line X-X' in FIG. 14.

Referring to FIGS. 14 and 15, a second embodiment is different from the first embodiment in terms of the channel length CL of the element located centrally and the doping concentration of the p-type base region BR, BCR. Specifically, in the second embodiment, the channel length CL of the IGBTCD (located centrally) is the same as the channel length CL of the IGBTED (located at the extreme end). Furthermore, as shown in FIG. 15, the doping concentration of the p-type region BR of the IGBTCD (located centrally) is higher than the doping concentration of the p-type base regions BR, BCR of the IGBTED (located at the extreme end).

The other elements of the second embodiment are almost the same as those of the first embodiment. The same elements are designated by the same reference signs and their descriptions are not repeated.

As mentioned above, in the second embodiment, the doping concentration of the p-type region BR of the IGBTCD (located centrally) is higher than the doping concentration of the p-type base region BR, BCR of the IGBTED (located at the extreme end). Therefore, the current of the IGBTCD (located centrally) can be smaller than the current of the IGBTED (located at the extreme end). In other words, the current capability of the IGBT at the extreme end can be larger than the current capability of the IGBT located centrally.

Referring to FIG. 10, resistance Rwell of the p-type base region BR, BCR can be lower. Consequently, the operation of the parasitic bipolar can be reduced. Therefore, overcurrent which may occur when the parasitic bipolar turns on can be suppressed.

Third Embodiment

Figure 16:
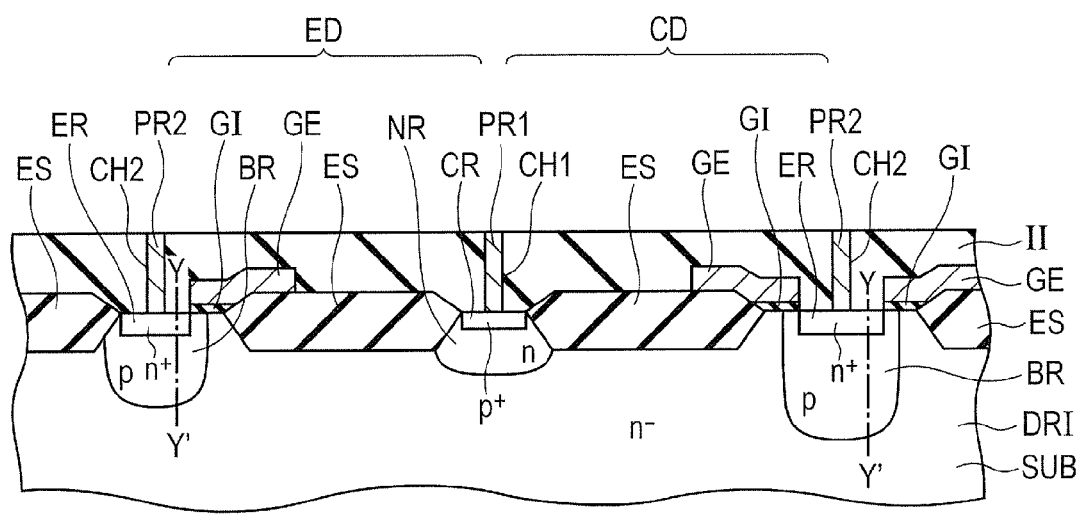
FIG. 16 s a sectional view showing an element located centrally and an element located at an extreme end in a semiconductor device according to a third embodiment of the present invention.
Figure 17:
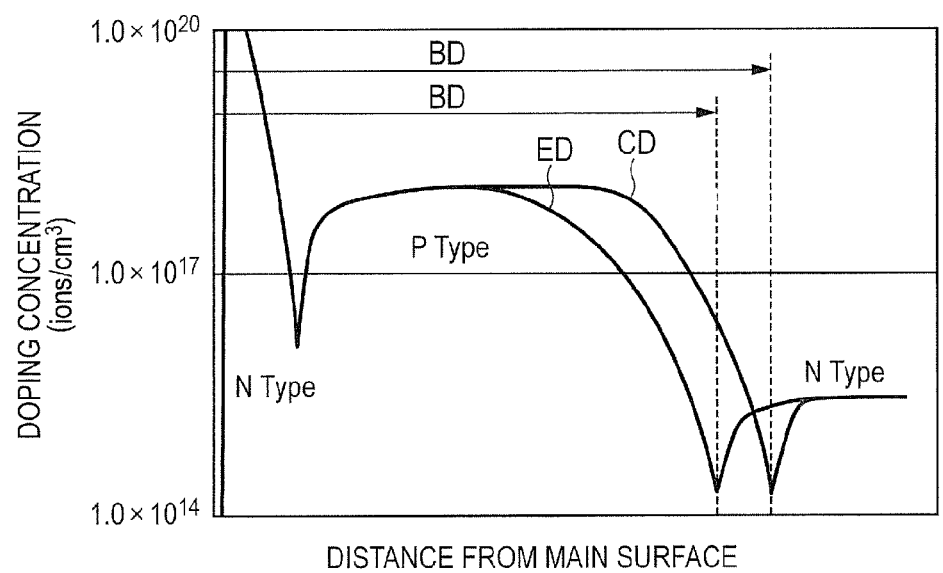
FIG. 17 is a graph showing the doping profile along the line Y-Y' in FIG. 16.

Referring to FIGS. 16 and 17, a third embodiment is different from the first embodiment in the channel length CL of the element located centrally and the doping profile depth of the p-type base region BR, BCR. Specifically, in the third embodiment, the channel length of the IGBTCD (located centrally) is the same as the channel length CL of the IGBTED (located at the extreme end).

Furthermore, as shown in FIG. 17, the p-type base region BR, BCR of the IGBTCD (located centrally) extends to a deeper position from the main surface than the p-type base region BR, BCR of the IGBT located at the extreme end. The doping profile in the Y-Y' zone in FIG. 17 represents change in the doping concentration of the area from the n+ emitter region ER through the p-type base region BR to the n− drift region DRI. The base region depth BD of the IGBTCD (located centrally) and the base region depth BD of the IGBTED (located at the extreme end) each represent the length from the main surface to the end of the high p-type doping concentration region as shown in FIG. 8. The base region depth BD of the IGBTCD (located centrally) is larger than the base region depth BD of the IGBTED (located at the extreme end).

The other elements of the second embodiment are almost the same as those of the first embodiment. The same elements are designated by the same reference signs and their descriptions are not repeated.

Figure 18:
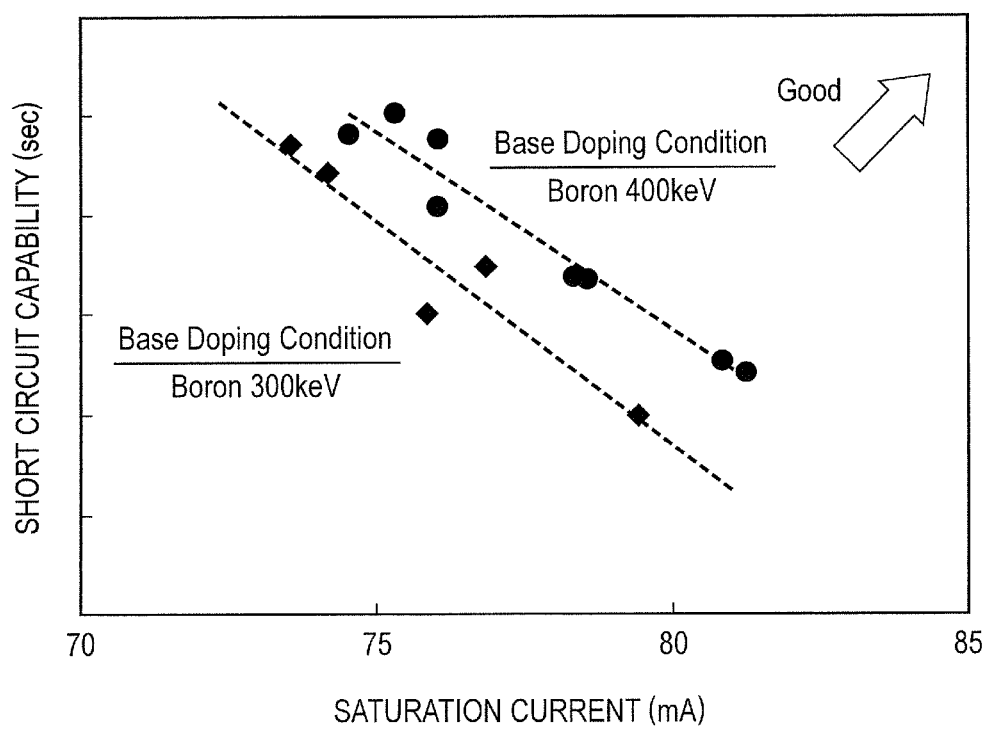
FIG. 18 is a graph showing the relation between short circuit capability and saturation current in different base doping conditions.

Referring to FIG. 18, the inventors investigated the relation between short circuit capability and saturation current in different base doping conditions. The same dosage was used in the test. The short circuit capability was higher in the higher base doping condition. The inventors have found that since the base region depth is deeper in the higher base doping condition, the short circuit capability is higher when the base region depth is deeper.

As mentioned above, in this embodiment, the p-type base region BR, BCR of the IGBTCD (located centrally) extends down to a deeper position from the main surface than the p-type base region BR, BCR of the IGBT located at the extreme end. Therefore, referring to FIG. 10, resistance Rwell of the p-type base region BR, BCR is lowered. Consequently, the operation of the parasitic bipolar is suppressed. This suppresses overcurrent which may occur when the parasitic bipolar turns on.

Fourth Embodiment

Figure 19:
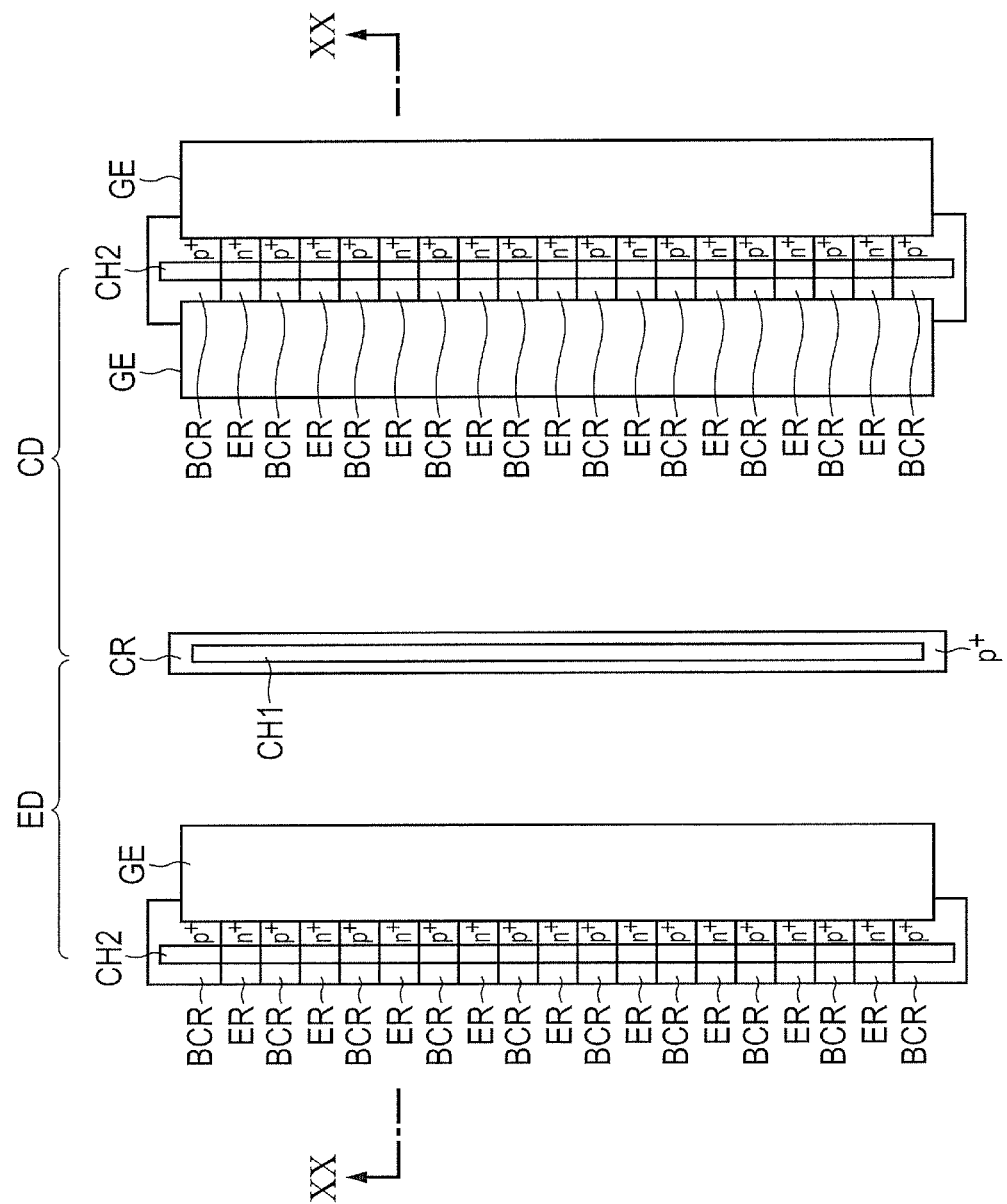
FIG. 19 is a plan view showing an element located centrally and an element located at an extreme end in a semiconductor device according to a fourth embodiment of the present invention.
Figure 20:
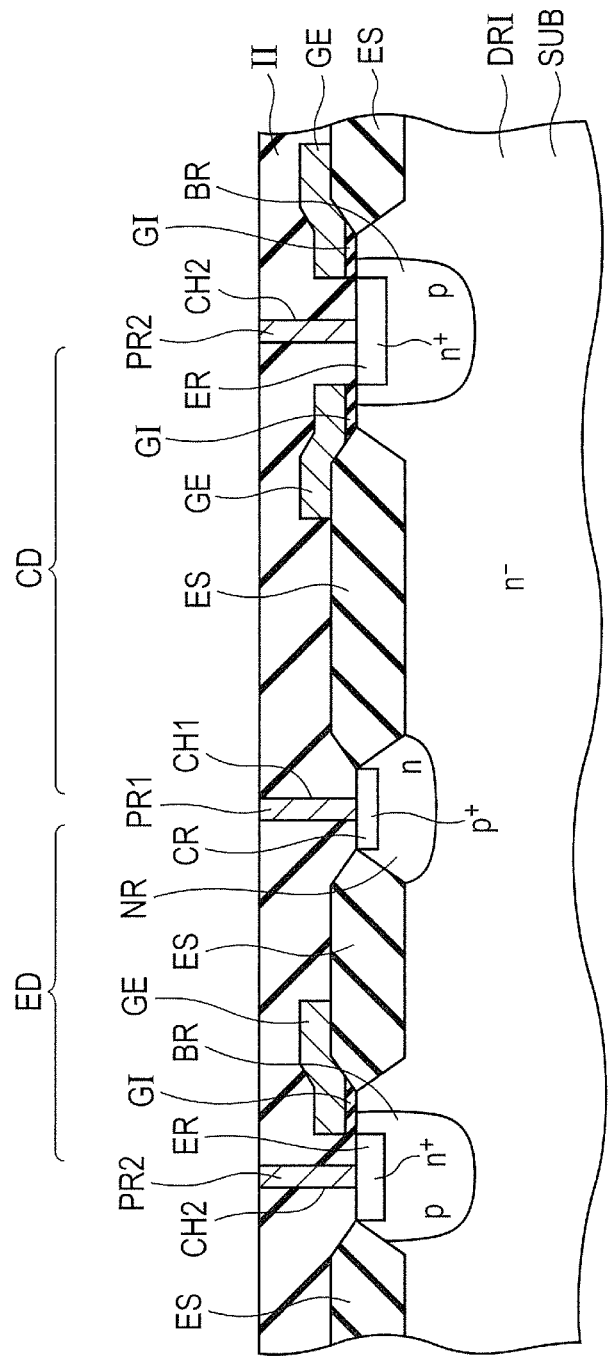
FIG. 20 is a schematic sectional view taken along the line XX-XX in FIG. 19.

Referring to FIGS. 19 and 20, a fourth embodiment is different from the first embodiment in the channel length CL of the element located centrally and the n− drift region DRI. Specifically, in the fourth embodiment, the channel length CL of the IGBTCD (located centrally) is the same as the channel length CL of the IGBTED (located at the extreme end).

Furthermore, the n− drift region DRI of the IGBT located centrally is longer than the n− drift region DRI of the IGBT located at the extreme end.

The other elements of the fourth embodiment are almost the same as those of the first embodiment. The same elements are designated by the same reference signs and their descriptions are not repeated.

As mentioned above, in this embodiment, the n− drift region DRI of the IGBT located centrally is longer than the n− drift region DRI of the IGBT located at the extreme end. Therefore, the current of the IGBTCD (located centrally) can be smaller than the current of the IGBTED (located at the extreme end). In other words, the current capability of the IGBT located at the extreme end can be higher than the current capability of the IGBT located centrally.

Furthermore, the heat capacity of the IGBTCD (located centrally) can be larger than the heat capacity of the IGBTED (located at the extreme end).

Fifth Embodiment

Figure 21:
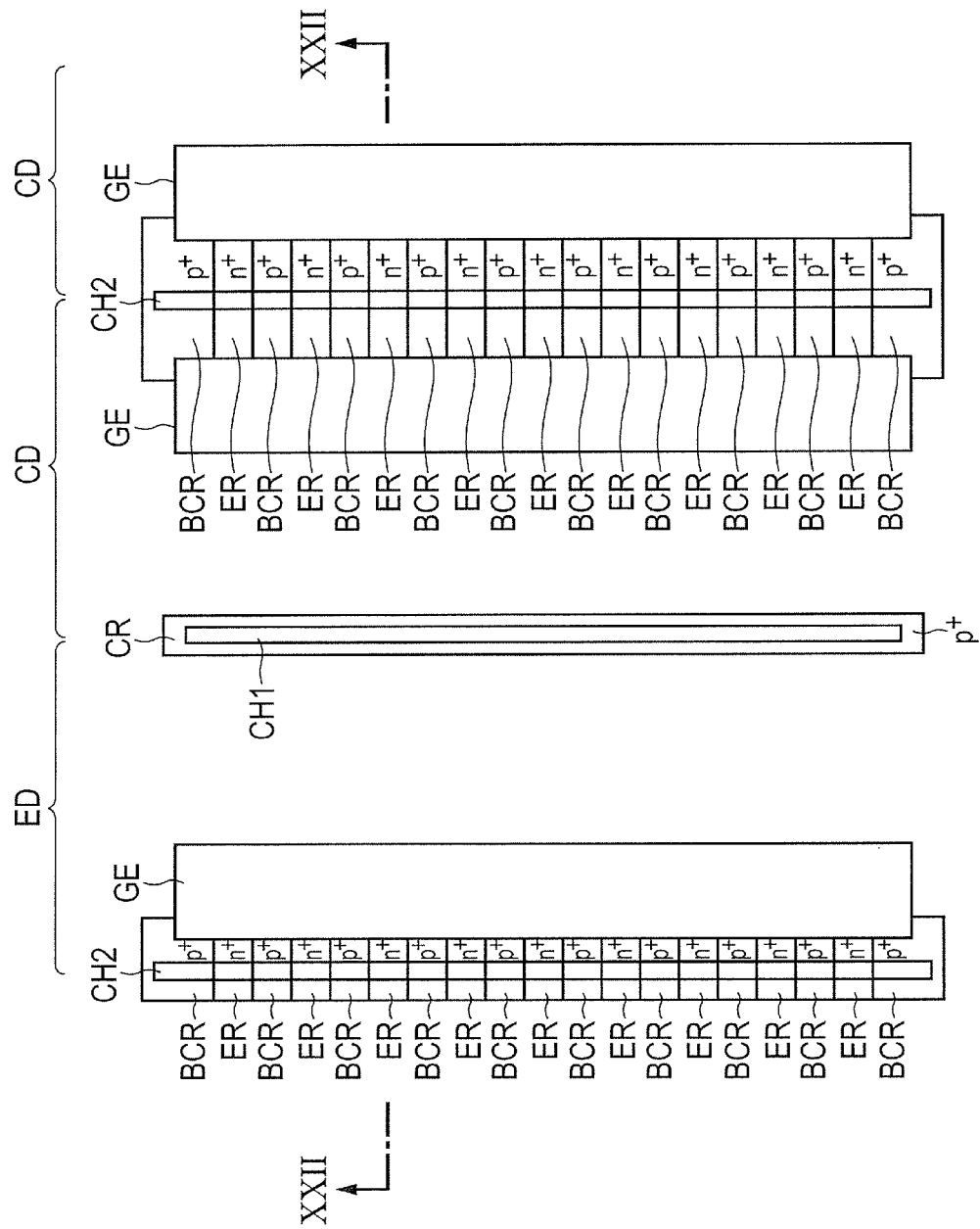
FIG. 21 is a plan view showing an element located centrally and an element located at an extreme end in a semiconductor device according to a fifth embodiment of the present invention.
Figure 22:
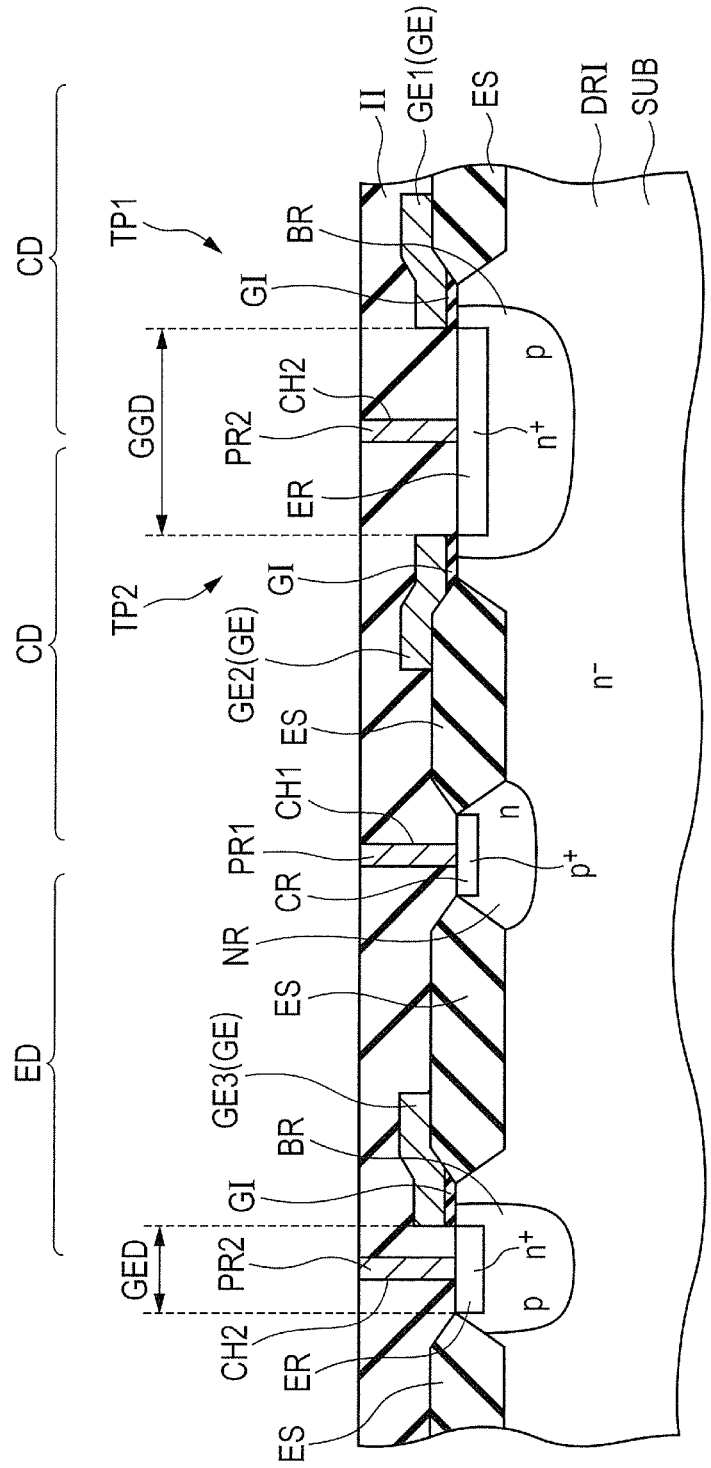
FIG. 22 is a schematic sectional view taken along the line XXII-XXII in FIG. 21.

Referring to FIGS. 21 and 22, a fifth embodiment is different from the first embodiment in the channel length CL of the element located centrally and the distance between gate electrodes. Specifically, in the fifth embodiment, the channel length CL of the IGBTCD (located centrally) is the same as the channel length CL of the IGBTED (located at the extreme end).

The elements CD located centrally have a first insulated gate transistor part TP1 and a second insulated gate transistor part TP2 which are located symmetrically to each other in one direction. The first and second insulated gate transistor parts TP1 and TP2 include a first gate electrode GE1 and a second gate electrode GE2 formed over the p-type base region BR, BCR formed in the main surface, respectively. The IGBT located at the extreme end has a third gate electrode GE3 formed over the main surface. The distance between the first and second gate electrodes GE1 and GE2 in the above one direction is more than twice as long as the distance between the third gate electrode GE3 and the element separation structure ES opposite to it.

The other elements of the fifth embodiment are almost the same as those of the first embodiment. The same elements are designated by the same reference signs and their descriptions are not repeated.

As mentioned above, in the fifth embodiment, the distance between the first and second gate electrodes GE1 and GE2 in the above one direction is more than twice as long as the distance between the third gate electrode GE3 and the element separation structure ES opposite to it. Therefore, the width of the p-type base region BR, BCR of the IGBTCD (located centrally) can be larger than the width of the p-type base region BR, BCR of the IGBTED (located at the extreme end). Consequently, the heat capacity of the IGBTCD (located centrally) can be larger than the heat capacity of the IGBTED (located at the extreme end).

Sixth Embodiment

Figure 23:
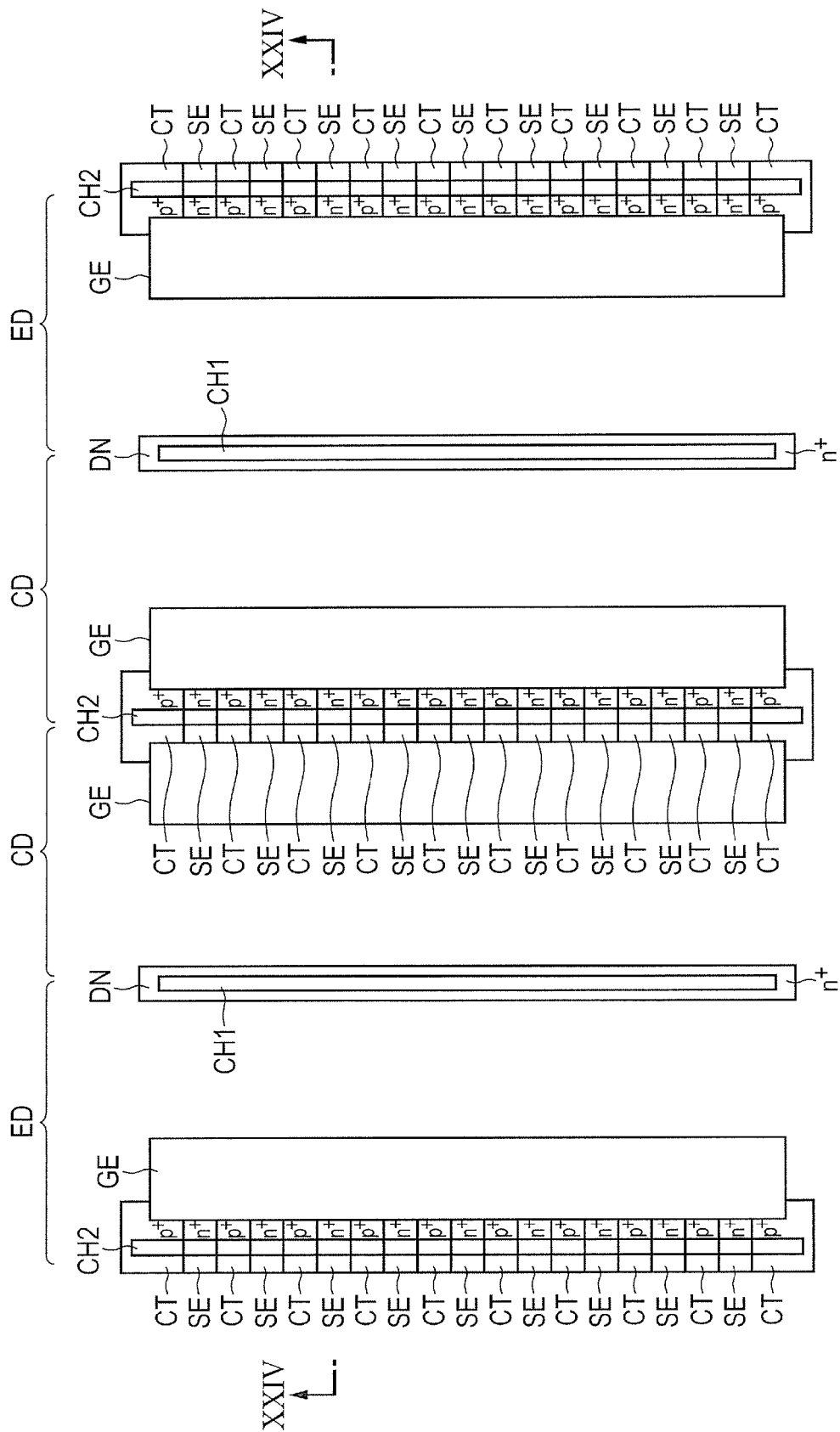
FIG. 23 is a plan view showing an element located centrally and an element located at an extreme end in a semiconductor device according to a sixth embodiment of the present invention.
Figure 24:
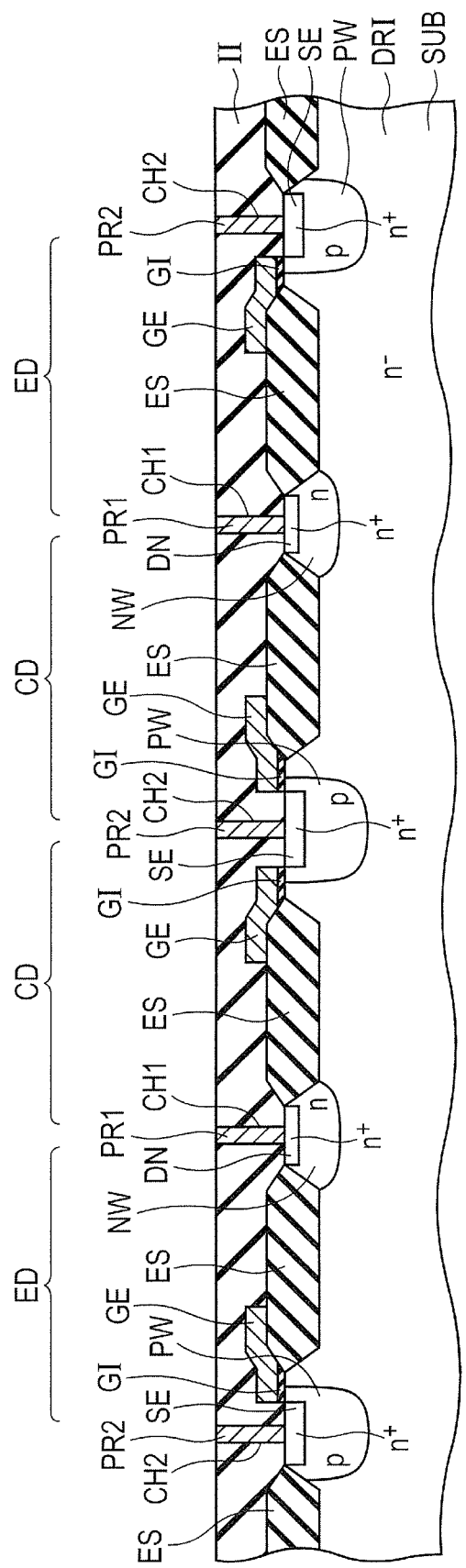
FIG. 24 is a schematic sectional view taken along the line XXIV-XXIV in FIG. 23.

Referring to FIGS. 23 and 24, a sixth embodiment is different from the first to fifth embodiments in that it relates to a high-breakdown voltage NMOS (N channel Metal Oxide Semiconductor). Specifically, this embodiment is mainly different in the n+ drain region DN and n+ source region SE. The high-breakdown voltage NMOS elements each include an n+ drain region (first conductivity type drain region) DN formed in the semiconductor substrate SUB, a p-type base region (second conductivity type base region) PW formed in the main surface separately from the n+ drain region DN, and an n+ source region (first conductivity type source region) SE formed in the main surface in the p-type base region PW.

In this embodiment as well, the current capability of an element ED located at an extreme end is larger than the current capability of an element CD located centrally.

Specifically, the channel length CL of an element CD located centrally may be longer than the channel length CL of an element located at an extreme end. Also, the doping concentration of the p-type base region PW of the element CD located centrally may be higher than the doping concentration of the p-type base region PW of the element ED located at the extreme end. Also, the p-type base region PW of the element located centrally may extend down to a deeper position from the main surface than the p-type base region PW of the element located at an extreme end. Also, the n− drift region DRI of the element located centrally may be longer than the n− drift region DRI of the element ED located at the extreme end. Also, in the above one direction, the distance between the first and second gates GE1 and GE2 may be more than twice as long as the distance between the third gate GE3 and the element separation structure ES opposite to it.

The other elements of the sixth embodiment are almost the same as those of the first to fifth embodiments. The same elements are designated by the same reference signs and their descriptions are not repeated.

The sixth embodiment also brings about the same advantageous effects as the first to fifth embodiments.

Seventh Embodiment

Figure 25:
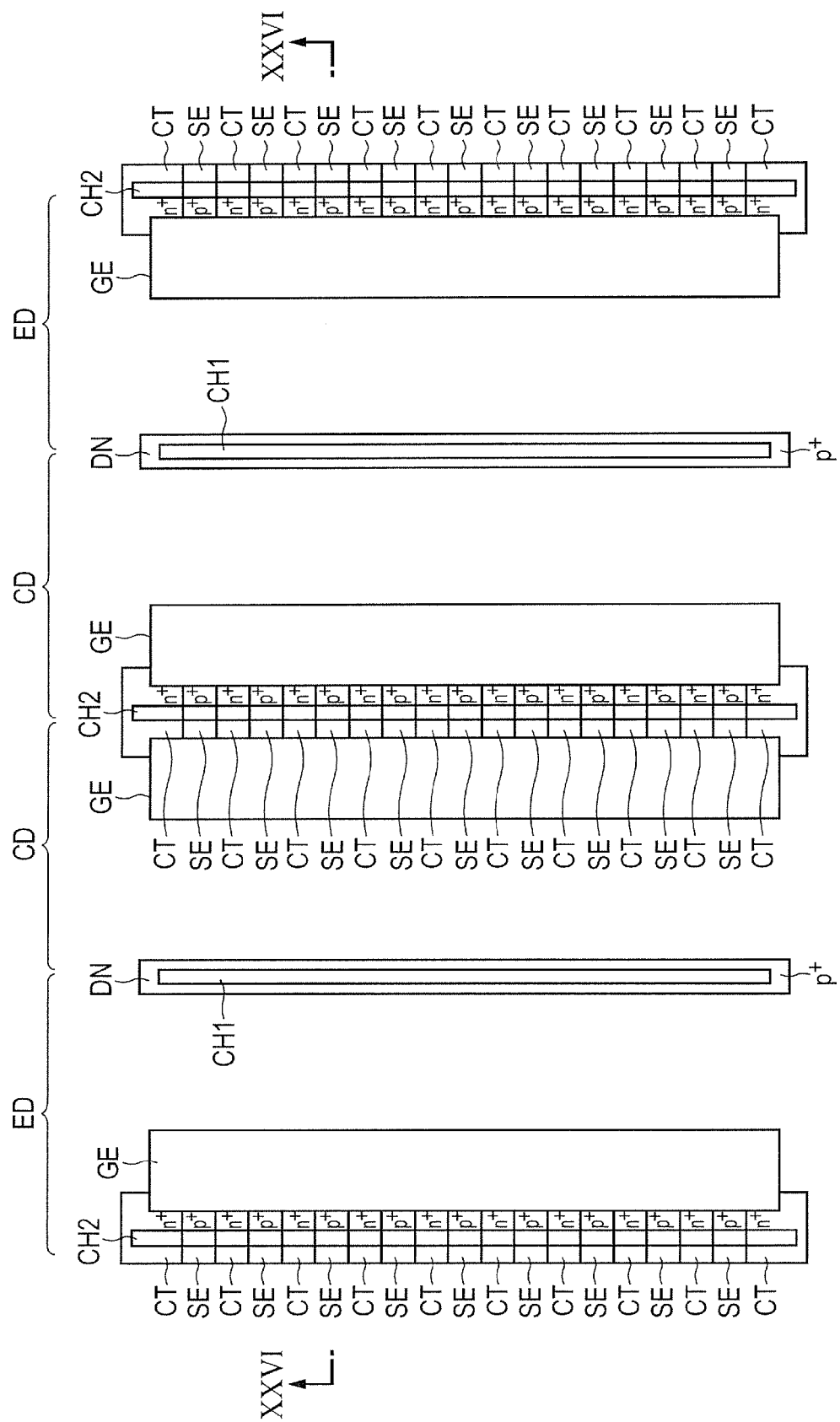
FIG. 25 is a plan view showing an element located centrally and an element located at an extreme end in a semiconductor device according to a seventh embodiment of the present invention.
Figure 26:
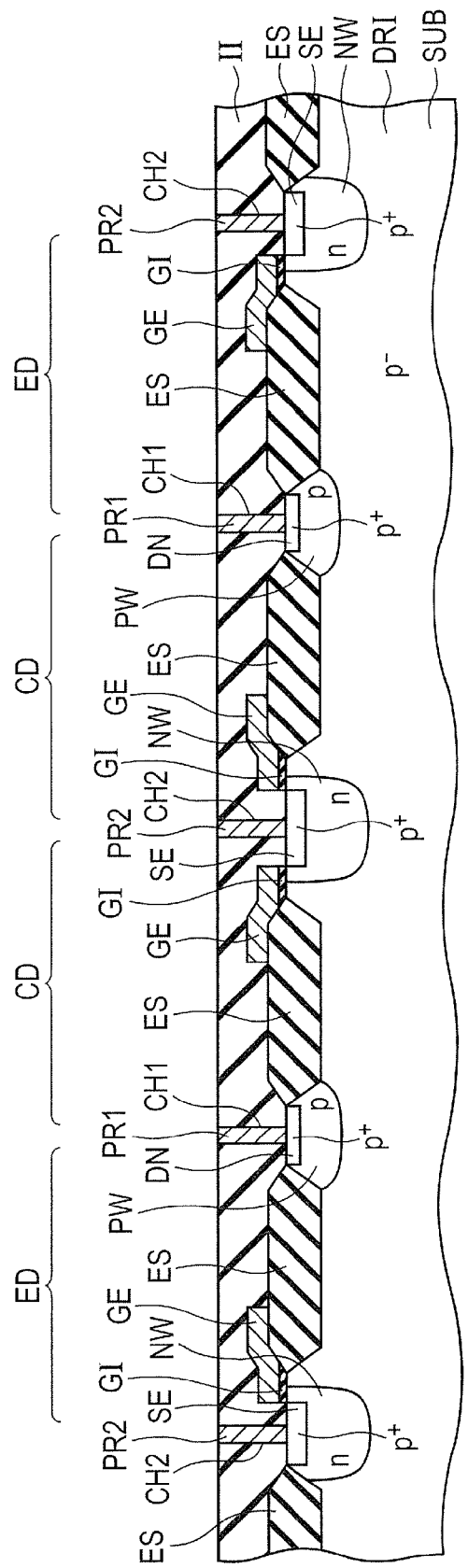
FIG. 26 is a schematic sectional view taken along the line XXVI-XXVI in FIG. 25.

Referring to FIGS. 25 and 26, a seventh embodiment is different from the sixth embodiment in that it relates to a high-breakdown voltage PMOS (P channel Metal Oxide Semiconductor). Specifically, this embodiment is mainly different in that a p-type channel is formed.

The other elements of the seventh embodiment are almost the same as those of the sixth embodiment. The same elements are designated by the same reference signs and their descriptions are not repeated.

The seventh embodiment also brings about the same advantageous effects as the sixth embodiment.

Eighth Embodiment

Figure 27:
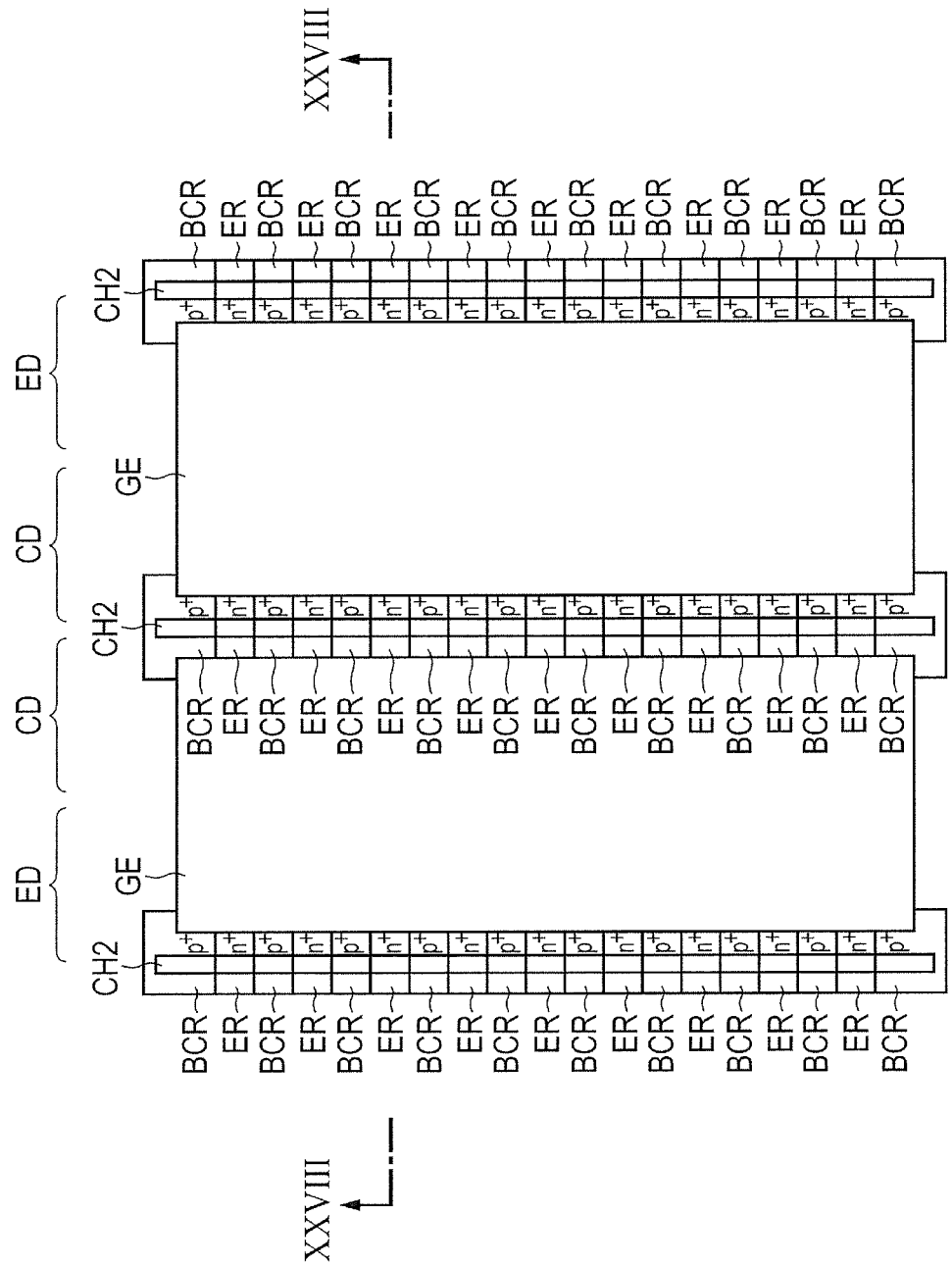
FIG. 27 is a plan view showing an element located centrally and an element located at an extreme end in a semiconductor device according to an eighth embodiment of the present invention.
Figure 28:
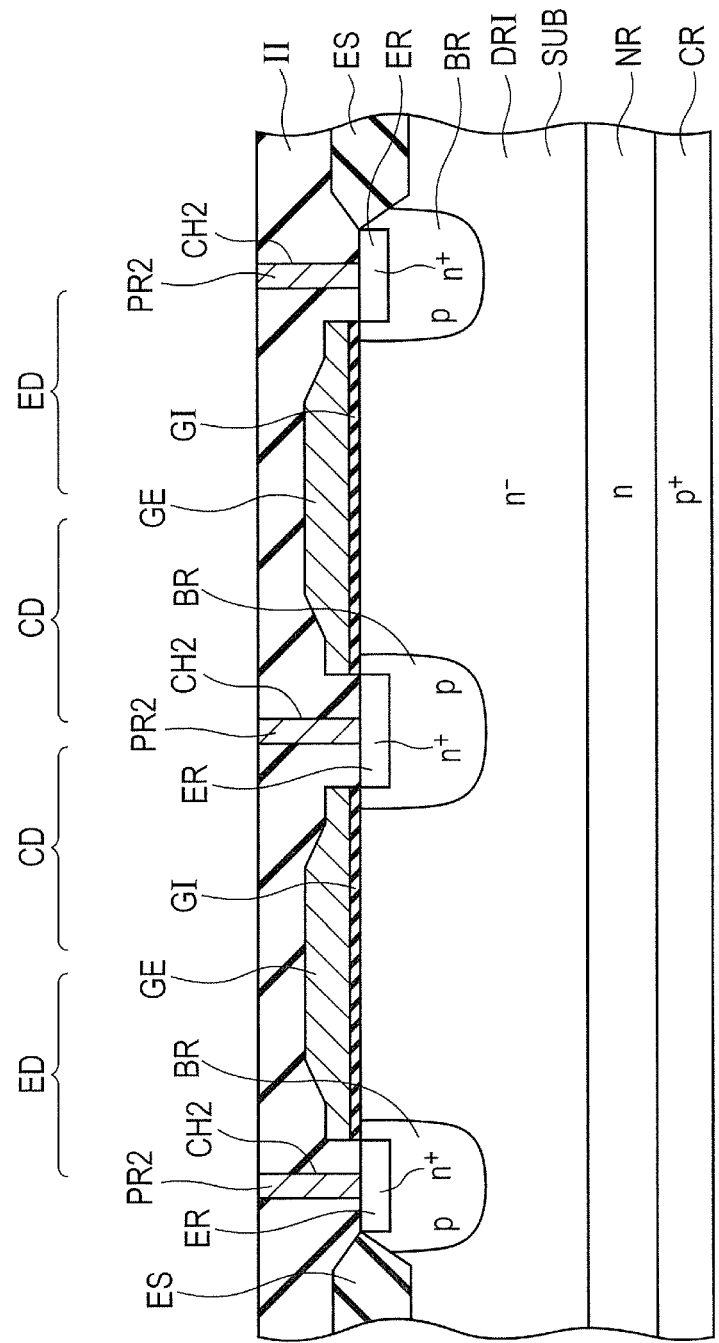
FIG. 28 is a schematic sectional view taken along the line XXVIII-XXVIII in FIG. 27.

Referring to FIGS. 27 and 28, an eighth embodiment is different from the first to fifth embodiments in that it relates to a vertical IGBT. Specifically, this embodiment is mainly different in that a p+ collector region CR is formed in the surface opposite to the main surface and an n-type region NR is formed over the p+ collector region CR.

The other elements of the eighth embodiment are almost the same as those of the first to fifth embodiments. The same elements are designated by the same reference signs and their descriptions are not repeated.

The eighth embodiment also brings about the same advantageous effects as the first to fifth embodiments.

Ninth Embodiment

Figure 29:
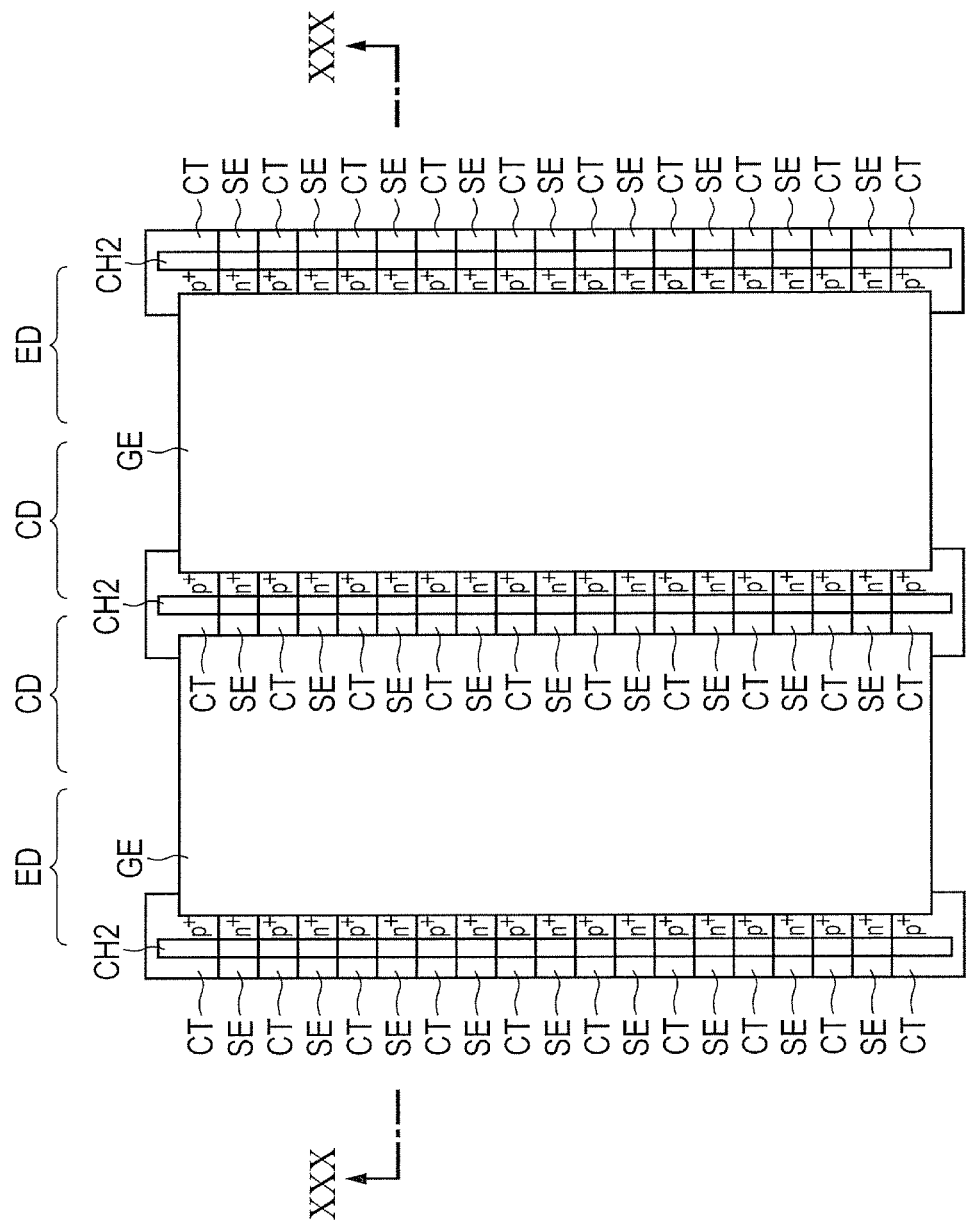
FIG. 29 is a plan view showing an element located centrally and an element located at an extreme end in a semiconductor device according to a ninth embodiment of the present invention.
Figure 30:
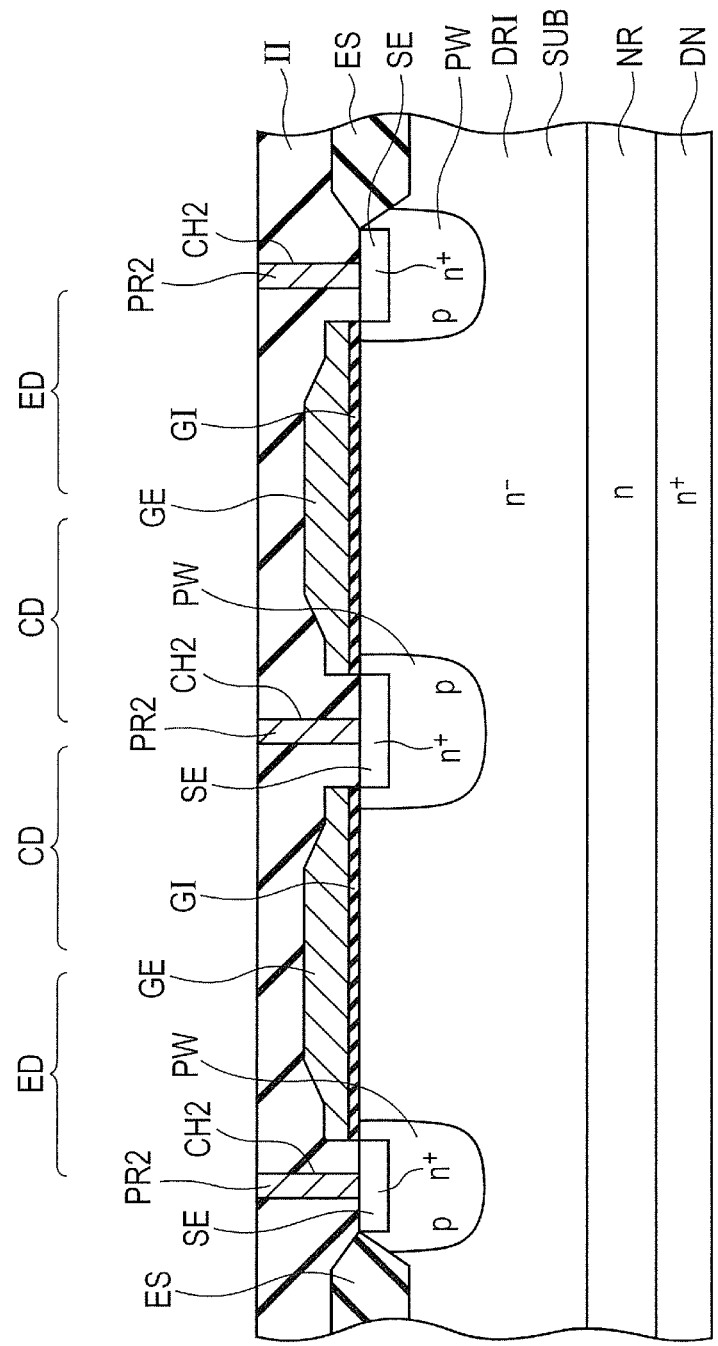
FIG. 30 is a schematic sectional view taken along the line XXX-XXX in FIG. 29.

Referring to FIGS. 29 and 30, a ninth embodiment is mainly different from the sixth embodiment in that it relates to a vertical high-breakdown voltage NMOS. Specifically, this embodiment is mainly different in that an n+ drain region DN is formed in the surface opposite to the main surface and an n-type region NR is formed over the n+ drain region DN.

The other elements of the ninth embodiment are almost the same as those of the sixth embodiment. The same elements are designated by the same reference signs and their descriptions are not repeated.

The ninth embodiment also brings about the same advantageous effects as the sixth embodiment.

Any combination of the above embodiments may be made as appropriate.

The invention made by the present inventors has been so far explained concretely in reference to the preferred embodiments thereof. However, the invention is not limited thereto and it is obvious that these details may be modified in various ways without departing from the spirit and scope thereof.

What is claimed is:

1. An Insulated Gate Bipolar Transistor (IGBT) comprising:
    a semiconductor substrate having a main surface; and
    elements having a plurality of insulated gate transistor parts arranged in a row in one direction over the main surface;
    the elements including a first element located at an end of the row in the one direction; and a second element located more centrally in the row in the one direction than the first element;
    wherein the first element includes a first insulated gate transistor part, and the second element includes a second insulated gate transistor part and a third insulated gate transistor part that are arranged symmetrically to each other in the one direction, and
    wherein current capability of the first element located at the end is higher than current capability of the second element located centrally,
    wherein the first insulated gate transistor part includes a first gate electrode formed over a portion of a first base region at a first side of the first base region and a portion of a first element separation structure formed in the main surface, the first base region being formed in the main surface;
    wherein the second insulated gate transistor part and the third insulated gate transistor part include a second gate electrode and a third gate electrode, respectively, which are formed over a second base region formed in the main surface, the second base region being common to the second gate electrode and the third gate electrode,
    wherein in the one direction, a distance between the second gate electrode and the third gate electrode is more than twice as long as a distance between the first gate electrode and a second element separation structure formed on a second side of the first base region that is opposite to the first side of the first base region, and
    wherein a channel length of the second element located centrally is same as a channel length of the first element located at the end.

2. The IGBT according to claim 1, the insulated gate transistor parts each comprising:
    a first conductivity type collector region formed in the semiconductor substrate;
    a first conductivity type base region, which includes the first and the second base regions, formed in the main surface separately from the collector region; and
    a second conductivity type emitter region formed in the main surface in the first conductivity type base region,
    wherein doping concentration of the second base region of the second element located centrally is higher than doping concentration of the first base region of the first element located at the end.

3. The IGBT according to claim 1, the insulated gate transistor parts each comprising:

a first conductivity type drain region formed in the semiconductor substrate;
a second conductivity type base region, which includes the first and the second base regions, formed in the main surface separately from the drain region; and
a first conductivity type source region formed in the main surface in the second conductivity type base region,
wherein doping concentration of the second base region of the second element located centrally is higher than doping concentration of the first base region of the first element located at the extreme end.

4. The IGBT according to claim 1, the insulated gate transistor parts each comprising:
a first conductivity type collector region formed in the semiconductor substrate;
a first conductivity type base region, which includes the first and the second base regions, formed in the main surface separately from the collector region; and
a second conductivity type emitter region formed in the main surface in the first conductivity type base region,
wherein the second base region of the second element located centrally extends down to a deeper position from the main surface than the first base region of the first element located at the end.

5. The IGBT according to claim 1, the insulated gate transistor parts each comprising:
a first conductivity type drain region formed in the semiconductor substrate;
a second conductivity type base region, which includes the first and the second base regions, formed in the main surface separately from the drain region; and
a first conductivity type source region formed in the main surface in the second conductivity type base region,
wherein the second base region of the second element located centrally extends down to a deeper position from the main surface than the first base region of the first element located at the end.

6. The IGBT according to claim 1, the insulated gate transistor parts each comprising:
a first conductivity type collector region formed in the semiconductor substrate;
a first conductivity type base region formed in the main surface separately from the collector region; and
a second conductivity type emitter region formed in the main surface in the first conductivity type base region,
wherein a drift region of the second element located centrally is longer than a drift region of the first element located at the end.

7. The IGBT according to claim 1, the insulated gate transistor parts each comprising:
a first conductivity type drain region formed in the semiconductor substrate;
a second conductivity type base region formed in the main surface separately from the drain region; and
a first conductivity type source region formed in the main surface in the second conductivity base region,
wherein a drift region of the second element located centrally is longer than a drift region of the first element located at the end.

* * * * *